(12) United States Patent
Ehrmann et al.

(10) Patent No.: US 7,538,564 B2
(45) Date of Patent: May 26, 2009

(54) METHODS AND APPARATUS FOR UTILIZING AN OPTICAL REFERENCE

(75) Inventors: Jonathan S. Ehrmann, Sudbury, MA (US); Patrick S. Duffy, N. Andover, MA (US); Markus M. Weber, Malden, MA (US); Gregg A. Metzger, Andover, MA (US); Joseph V. Lento, Methuen, MA (US); Pierre-Yves Mabboux, Billerica, MA (US); Jens Zink, Lakeville, MA (US); Yun Fee Chu, Natick, MA (US)

(73) Assignee: GSI Group Corporation, Bedford, MA (US)

( * ) Notice: Subject to any disclaimer, the term of this patent is extended or adjusted under 35 U.S.C. 154(b) by 10 days.

(21) Appl. No.: 11/582,829

(22) Filed: Oct. 18, 2006

(65) Prior Publication Data

US 2007/0096763 A1    May 3, 2007

Related U.S. Application Data

(60) Provisional application No. 60/727,607, filed on Oct. 18, 2005.

(51) Int. Cl.
 *G01R 31/302*  (2006.01)
 *G01R 31/28*  (2006.01)
(52) U.S. Cl. .................................. 324/752; 324/158.1
(58) Field of Classification Search .............. 324/158.1, 324/751–758; 356/139.04–139.08, 399–401, 356/490, 508, 614, 622
See application file for complete search history.

(56) References Cited

U.S. PATENT DOCUMENTS

| | | | |
|---|---|---|---|
| 4,154,530 A * | 5/1979 | Connolly et al. ....... 356/139.05 |
| 4,307,338 A | 12/1981 | Frederiksen et al. | |
| 4,677,474 A | 6/1987 | Sato et al. | |
| 4,929,893 A | 5/1990 | Sato et al. | |
| 5,008,760 A | 4/1991 | Shimizu et al. | |
| 5,528,372 A * | 6/1996 | Kawashima ................ 356/401 |
| 5,999,268 A | 12/1999 | Yonezawa et al. | |
| 6,096,567 A | 8/2000 | Kaplan et al. | |
| 6,097,473 A * | 8/2000 | Ota et al. ...................... 355/53 |
| 6,501,061 B1 | 12/2002 | Kitai et al. | |
| 6,549,649 B1 | 4/2003 | Penkethman | |

(Continued)

OTHER PUBLICATIONS

Watec Co., Ltd.; WAT-525EX Monochrome Camera product sheet, 2004.
Electro Scientific Industries; ESI 2100 Thin-Film On Silicon Laser Trimming System product sheet, 2002.
Electro Scientific Industries; CVL Vision Tools Guide, "Point Matcher Tool Overview", 2004.

*Primary Examiner*—Ha Tran T Nguyen
*Assistant Examiner*—Joshua Benitez
(74) *Attorney, Agent, or Firm*—BainwoodHuang

(57) ABSTRACT

A laser processing system implements a method for aligning a probe element (e.g., a probe pin) with a device interface element (e.g., a contact pad of a circuit substrate). First, the laser processing system generates an optical reference beam at one or more predetermined positions to calibrate a reference field. The laser processing system then detects a position of the probe element in the reference field. The laser processing system also determines a relative position of the device interface element in the reference field. Based on the position of the probe element and the device interface element, the laser processing system then initiates alignment of the probe element and the device interface element. In one application, alignment of the probe element and the device interface element further includes contacting the probe element to the device interface element to make an electrical connection.

23 Claims, 12 Drawing Sheets

U.S. PATENT DOCUMENTS

| | | |
|---|---|---|
| 6,678,058 B2 | 1/2004 | Baldwin et al. |
| 6,753,524 B2 * | 6/2004 | Matsui et al. ............... 250/310 |
| 6,906,546 B2 * | 6/2005 | Tanioka et al. ............. 324/765 |
| 7,119,560 B2 * | 10/2006 | Nihei et al. ................. 324/754 |
| 7,382,389 B2 * | 6/2008 | Cordingley et al. ......... 347/224 |
| 2003/0142861 A1 | 7/2003 | Penkethman |
| 2005/0099190 A1 * | 5/2005 | Li et al. ...................... 324/752 |
| 2005/0194990 A1 | 9/2005 | Gothoskar et al. |

* cited by examiner

METHODS AND APPARATUS FOR UTILIZING AN OPTICAL REFERENCE

CROSS REFERENCE TO RELATED APPLICATIONS

This application claims the benefit under 35 U.S.C. §119(e) of U.S. Provisional Application No. 60/727,607 filed Oct. 18, 2005, the disclosure of which is hereby incorporated by reference in its entirety.

BACKGROUND

Laser trimming is generally used in the manufacture of electronic circuits to adjust parameter values to be within desired ranges. So called thin film laser trimmers perform laser trimming by applying laser energy to thin film elements associated with arrays of devices disposed on a respective wafer substrate.

To set up a wafer for laser processing, a probe system associated with a respective laser trimmer system mechanically translates and orients a wafer into position so that a set of test pads on the wafer aligns with a corresponding set of probe pins. After wafer alignment, the laser trimmer then initiates contacting the set of probe pins to the corresponding test pads of the wafer. Consequently, the laser trimmer system can then apply and measure electrical signals associated with a corresponding device under test disposed on the wafer. The laser trimmer modifies the corresponding device under test by applying laser energy to certain regions of the device under test. More specifically, the laser trimmer system modifies material or physical properties of the device under test by applying discrete amounts of laser energy to the regions of the device and as a result the respective characteristics of the device under test eventually fall within a desired range.

Typically, a wafer includes many duplicate devices or "dice", each containing one or more circuits on the same substrate. Each of the devices has an associated set of test pads that form a footprint in a plane of the wafer substrate. A corresponding set of probe pin tips in a probe card match the foot print so that each of the respective probe pins on the probe card contacts a respective contact pad of the wafer when the probe card (e.g., plane of the probe tips) or the wafer is moved to make contact with a corresponding set of contact pads on the wafer.

SUMMARY

Conventional probe alignment methods are quite useful because they enable contact of a set of probe pins to a corresponding set of contact pads for applying test signals and measuring parameters of a device under test. However, conventional probe alignment methods do not provide an easy way to align and contact an array of probe pins with a corresponding footprint of contact pads on a wafer substrate in a laser trimming system. For example, conventional probe alignment methods typically include use of a physical reference point (e.g., a fiducial reference used for calibration) in an imaging field for determining a relative position of probe pins with respect to the contact elements of a respective aligned wafer. Conventional techniques of aligning a set of probes to a corresponding set of contact pads in an integrated trimming system can be burdensome to use because such techniques typically require an operator to manually apply iterative adjustment steps to align a set of probe pins.

It is to be understood that a device may be part of an array of devices on a wafer substrate (e.g. a semiconductor wafer) or part of an array of devices on a non-wafer substrate (e.g. a tape frame). Likewise, a device may not be part of an array but may be a single device or a device on an associated mount. A device can include one or more circuits, one or more circuit elements or one or more non-circuit elements. The device may be an electrical device, an optical device, a mechanical device, a chemical device, a biological device, a micro electromechanical system device (MEMS) or any other device probed with aligned probe elements and having regions laser processed to modify the device in conjunction with probing. The device may be laser processed at ambient conditions or may be processed in a modified environment, for example non-ambient, pressure, temperature, humidity, etc.

Techniques discussed herein differ from conventional methods such as those discussed above as well as additional conventional techniques. In particular, certain embodiments herein are directed to detecting a position of a contact element such as a probe pin tip based at least in part on generation or use of an optical reference beam.

For example, in an example embodiment, a system (e.g., a laser processing system according to embodiments herein) implements a method for aligning a probe element with a device interface element (e.g., a contact pad of a circuit substrate). The system first generates an optical reference beam that intersects one or more predetermined positions to calibrate a reference field. The system then detects a position of the probe element in the reference field. The system also determines a relative position of the device interface element in the reference field. Based on the position of the probe element and the device interface element, the system then aligns the probe element and the device interface element. In one embodiment, alignment of the probe element and the device interface element further includes contacting the probe element to the device interface element to make an electrical connection. Test signals can then be applied to a respective device under test.

In the context of a laser trimmer application, a laser system that is used to trim circuits disposed on a wafer substrate also can be used to generate the above-mentioned optical reference beam that is used for aligning the probe element to the device interface element. Thus, in the context of a laser trimmer application according to an embodiment herein, there is no longer a need for a physical fiducial reference to achieve alignment as is required by conventional probe alignment methods. Instead, the optical reference beam supports pin-to-pad alignment.

As device feature sizes become finer with very small contact pads, high precision alignment of the array of probe tips to the contact pads is required. For example, for probe pins tips of about 20 microns or larger to hit the contact pads of about 25 microns or larger, it is desirable that they be aligned to the wafer to within about ±4 microns in x and y and about ±10 microns in z.

As mentioned above, conventional iterative manual probe alignment techniques are slow and cumbersome and have limited accuracy. For example, a probe card frame can be adjusted using a "through-the-lens" imaging system of a beam positioner to observe the non-contact side of the probe pins. Since the contact surfaces of the probe pins are not directly observable using this technique, errors in probe to pad alignment can result. Wafer probers with integral fiducial targets can provide automated probe alignment to a mounted beam positioner, but in combination such a system is large, complex and prone to excessive mechanical instabilities that can limit throughput speed and accuracy.

Therefore to overcome these limitations and to accurately and rapidly laser process wafer based device elements, a compact laser trimming system with a beam positioner rigidly coupled to a probing system and with accurate automated probe to pad alignment is needed.

Further limitations in laser trimming throughput may result from pulse energy drift and the time associated with measuring, monitoring and accurately setting pulse energy.

Non-optimized trimming may result from trimming coarse trim segments with a pulse energy or rate optimized for fine trimming, or when fine trimming with pulse energy optimized for coarse trim segments. For multi-leg trimming with both coarse and fine trim segments, an agile energy control is needed to efficiently maintain stable pulse energy and provide pulse energies and trim rates optimized for coarse and fine trimming.

One embodiment herein provides precise automated probe to pad alignment in an integrated probing/laser trimming system.

Another embodiment herein provides high-speed laser trimming based on use of integrated, rigidly coupled probing/laser trimming systems.

Another embodiment herein provides high speed laser trimming mechanically isolated from a system frame and environmental vibration.

Another embodiment herein provides a compact thin film laser trimming system having integrated wafer probing and laser trimming.

Another embodiment herein provides automated probe to pad alignment by directly referencing the processing field.

Another embodiment herein provides automated probe to pad alignment based on use of a dynamic reference beam.

Another embodiment herein provides efficient optimized pulse energy control.

Another embodiment herein provides improved coarse and fine trimming with optimized energy.

Accordingly, a compact, high speed, precision laser processing system with integrated wafer probing, fast settling and accurate automated probe pin alignment is disclosed. One embodiment of such a laser processing system herein includes a wafer probing system, a beam positioner system, a controller, and a test interface. The beam positioner system and wafer probing systems are rigidly coupled and mechanically isolated from the system frame. The probing system in such an embodiment features a probe viewing system responsive to probe pin tip and reference beam locations. The beam positioner system in such an embodiment features a wafer viewing system, a processing laser beam, an edge finding system, and a dynamic reference. The controller of such an embodiment is configured to interface with the probing system and the beam positioner system and to determine the position of the probe pins and wafer pads relative to a processing field or reference field. The controller is further configured to position devices within the processing field, to align and contact probe pins to wafer pads and to process device elements by directing the processing beam to locations within the processing field.

In at least one embodiment, the probing system includes a multi-axis stage (e.g. an x y z θ stage) configured to include a chuck that carries a wafer substrate having an array of circuit devices. Rigidly coupled via an isolated structure to the multi-axis stage, the probing system includes an adjustable probe card frame to automatically position probe cards with mounted test probe pins in at least one axis.

At least one embodiment of the current invention includes a probe viewing system, an adjustable probe card frame, image acquisition hardware configured to receive images from the probe viewing system, image processing software for determining positions of probe tips and laser spots from acquired images, and programmable illumination control of probe camera illuminators and through the lens illuminators.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Overview

Figure 1:
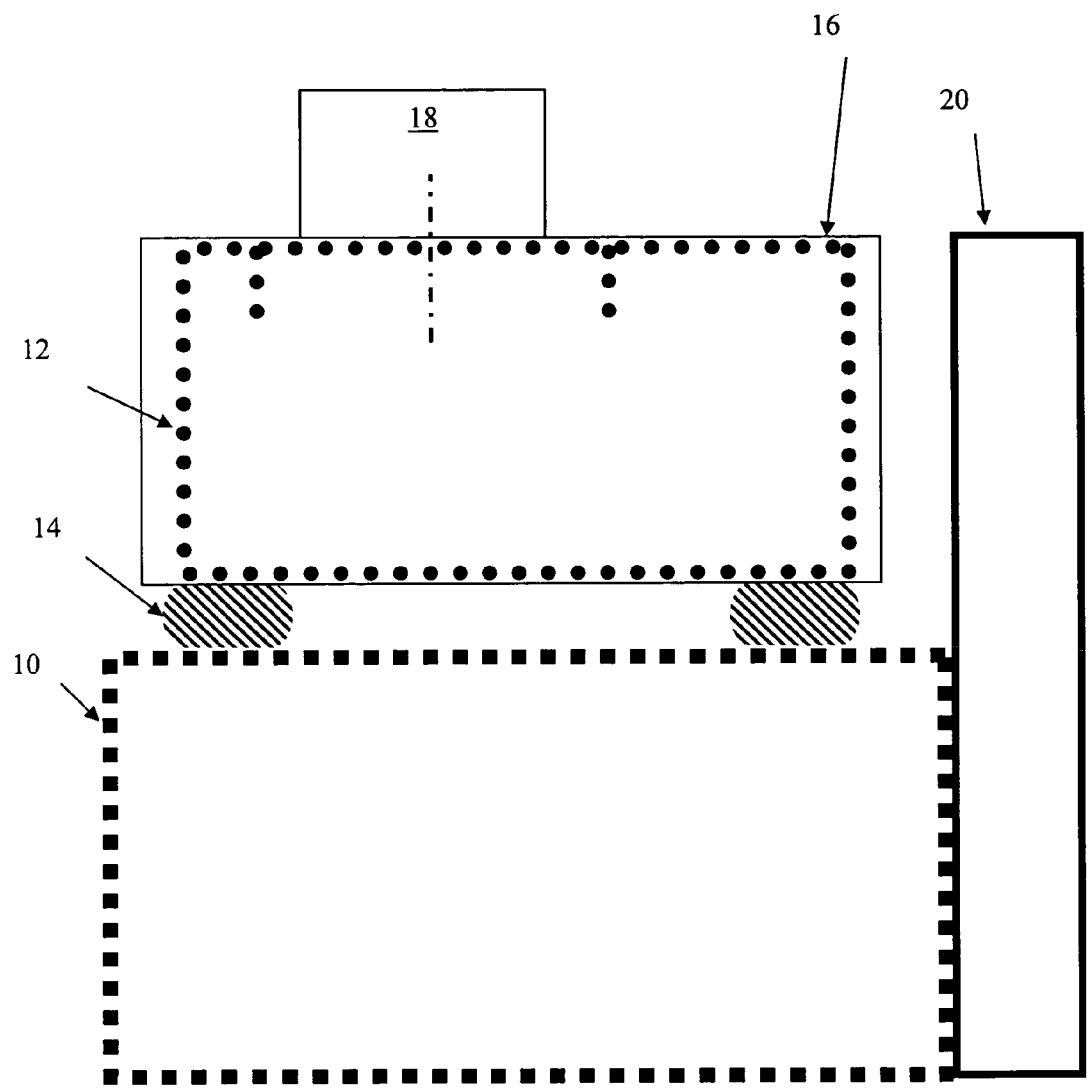
FIG. 1 is a diagram of an integrated trimmer and probing system with an associated wafer handler.

The general mechanical structure of a trimming system can be understood referring to FIG. 1. A system frame 10 carries a rigid structure 12 that is isolated from system frame 10 with vibration isolators 14. Mounted on the rigid structure 12 is a probing system 16 and a beam positioner system 18. Such a trimming system optionally includes an automated wafer handler 20.

Figure 2:
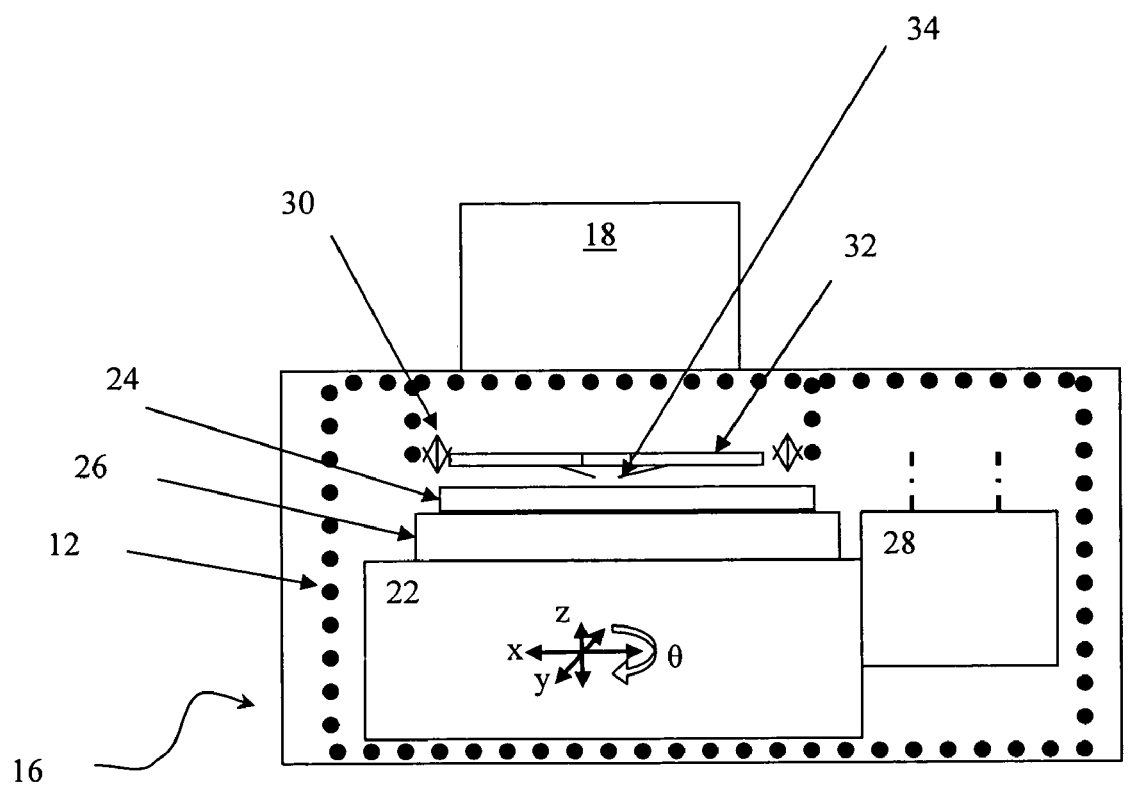
FIG. 2 is a diagram of rigidly coupled beam positioner and probing systems according to an embodiment herein.

Now referring to FIG. 2, probing system 16 includes a stage 22 that moves in the X, Y, Z axes. Stage 22 supports rotation of a wafer 24 and chuck 26 by an amount θ. Stage 22 carries chuck 26 and a probe viewing system 28. A wafer 24 to be processed is carried on the chuck 26. In one embodiment, the chuck 26 is a so-called "hot chuck" to heat the wafer 24. The probing system 16 also includes an automated adjustable probe card frame 30 that holds a probe card 32 with mounted test probe pins 34. Other elements potentially mounted on the stage 22 include a power monitor to measure optical power associated with an optical beam emitted from beam positioner 18, a scrubber for cleaning probe pin tips, an alignment fiducial, a radiation detecting aperture for scan field alignment, etc.

Description of a Specific Embodiment

Figure 3:
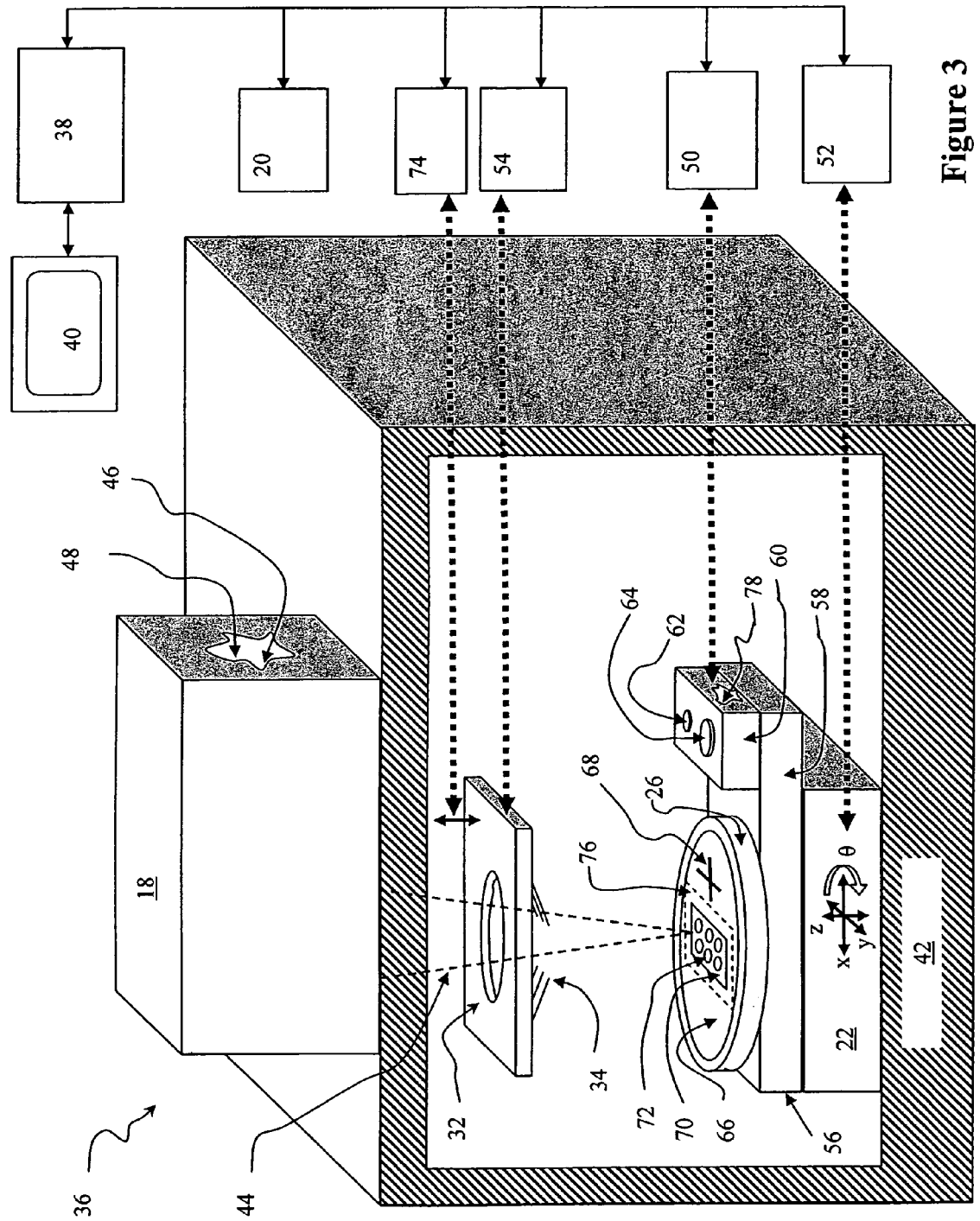
FIG. 3 is a diagram illustrating a laser trim system according to an embodiment herein.

FIG. 3 is a diagram illustrating a laser processing system 36 according to an embodiment herein. As shown, laser processing system 36 includes computer system 38 and corresponding display screen 40, rigid frame 42, beam positioner 18, optical beam 44, laser system 46, imaging system 48, wafer handler 20, image processing system 50, assembly position controller 52, test equipment 54, probe card 32, and assembly 56. Assembly 56 includes rigid frame 58, optical detection system 60 including low magnification objective 62 and high magnification objective 64, and chuck 26 to hold circuit substrate 66. Stage 22 initiates movement of assembly 56 and corresponding chuck 26. Circuit substrate 66 (e.g., a silicon wafer) on chuck 26 includes references 68 as well as circuit under test 70. Circuit under test 70 includes contact pads 72.

In general, laser processing system 36 implements a unique technique to align one or more probe elements (e.g., probe pin elements 34 associated with probe card 32) with respective one or more device elements (e.g., contact pads 72 associated with circuit under test 70 on circuit substrate 66). Rigid frame 42 of laser processing system 36 provides structural support to house a beam positioner 18 (e.g., optical beam 44, laser system 46, imaging system 48, etc.), as well as a probing system (e.g., probe card 32 and corresponding probe card position controller 74, etc.), and wafer positioning system (e.g., assembly 56 including circuit substrate 66). Since each of these systems is mounted to the same rigid frame 42, the systems can be aligned and calibrated as required to operate with respect to orthogonal X, Y, and Z axes associated with the rigid frame 42.

Prior to laser trimming, computer system 38 runs routines for calibration of the beam positioner 18 with respect to a reference field 76 for both imaging system 48 and optical beam 44, as well as calibration of imaging system 48 to the reference field 76 (e.g. pixels to microns). Accordingly, imaging system 48 can view and identify a location of respective objects in reference field 76. As will be discussed later in this specification, an energy level associated with optical beam 44 can be adjusted or attenuated. As mentioned, after being calibrated with respect to reference field 76, the beam positioner 18 directs imaging system 48 to view positions in reference field 76 (e.g., by deflecting the optical path of imaging system 48 with galvanometer scanners and imaging the reference field thru a laser scan lens ). Therefore, imaging system 48 can then be used to detect a position and orientation of objects in reference field 76. For example, imaging system 48 can be used to detect (e.g., view) an orientation and position of circuit substrate 66 in reference field 76 based on locating reference features 68 on circuit substrate 66. In one embodiment, imaging system 48 generates images of features such as reference features 68 and/or contact pads 72 viewed in the reference field 76. For example, images taken by imaging system 48 of circuit substrate 66 can be viewed by an operator (e.g., on display screen 40) or, more importantly, a machine vision system.

In one embodiment, a camera associated with imaging system 48 generates images on display screen 40 based on use of the same optical equipment that positions optical beam 44 in reference field 76. Consequently, beam positioner 18 serves dual purposes. For example, beam positioner 18 can be used to position optical beam 44 at known positions in reference field 76 for laser trimming as well as positioning a field of view associated with imaging system 48 to a known position in reference field 76 for determining a position and/or orientation of respective objects such as, circuit substrate 66, reference features 68, contact pads 72, etc.

Both optical detection system 60 and chuck 26 are rigidly mounted to rigid frame 58. Assembly position controller 52 generates control signals to stage 22, which moves rigid frame 58 with respect to rigid frame 42. For example assembly position controller 52 provides control signals to reposition portions of circuit substrate 66 in reference field 76. For example, assembly position controller 52 controls a movement of stage 22 in the X-Y plane. For example, assembly position controller 52 can control stage 22 to move rigid assembly 58 up and down parallel to the Z axis and to angularly rotate chuck 26 and corresponding circuit substrate 66 about a center axis of chuck 26 that is parallel to the Z axis. Rigid frame 58 optionally includes another mechanical assembly (not shown) disposed between rigid frame 58 and chuck 26 to angularly rotate chuck 26 and corresponding circuit substrate 66 about a center axis of chuck 26 that is parallel to the Z axis.

In one embodiment, assembly position controller 52 is also calibrated with respect to reference field 76 so that imaging system 48 can take into account a position or change in position of the assembly 56 (and circuit substrate 66) when determining a location of objects in a currently "viewed region" of reference field 76 at any given time. In one embodiment, calibration of the assembly 56 occurs prior to aligning the circuit substrate 66 in reference field 76.

Circuit under test 70 and corresponding contact pads 72 are disposed at a known relative position and/or orientation with respect to the reference features 68 on circuit substrate 66. Consequently, computer system 38 can determine a position of the contact pads 72 depending on a known position and orientation of the reference features 68 (and respective circuits on substrate 66) in reference field 76. In other words, laser processing system 36 first detects a position of reference feature 68 and thus a position of respective circuits on substrate 66 with respect to reference field 76. Computer system 38 can then determine a location of contact pads 72.

Information regarding a position of respective circuits on circuit substrate 66 as well as a footprint of respective contact pads 72 with respect to reference features 68 can be learned from determined feature positions of a single wafer (e.g., performing an inspection via use of imaging system 48) or by downloading such information from a wafer layout file that includes a map of circuit and contact pad positions. Subsequent wafers provided by wafer handler 20 can include circuits having substantially identical contact pad footprints and reference features. Each circuit substrate 66 can include many circuits (e.g., a fixed array of circuit devices) to be processed. Each of the circuits on circuit substrate 66 can have similar or different contact pad layout as circuit under test 70.

The layout file or learned information, as the case may be, associated with a circuit substrate 66 can include specifications regarding a relation of the other circuits on a respective circuit substrate relative to corresponding reference features thereon. Consequently, after alignment of circuit substrate 66 to reference field 76, beam positioner 18 can be used to view or laser trim any specific location on circuit substrate 66 based on control signals applied by assembly position controller 52 to assembly 56 and on control signals applied by a trim controller to beam positioner 18.

Thus, according to a technique disclosed herein, determining the relative position of a respective contact pad 72 (e.g., a device interface element) in the reference field 76 includes: detecting a position (e.g., in a space defined by the X, Y, and Z axes) of one or more reference features 68 on circuit substrate 70 in the reference field 76 and, thereafter, determining the position of the contact pad based on knowing a position of the respective contact pad with respect to the one or more reference feature 68 on the circuit substrate 66. That is, the position of the contact pad 72 (e.g., device interface element) with respect to the reference feature 68 can be determined based on either the position of the contact pad 72 as described in a mapping file (e.g., a identifying a layout and position of items with respect to each other) or a position of contact pads 68 with respect to one or more reference feature 68 as measured using imaging system 48. In the latter case, as mentioned, an operator can utilize imaging system 48 to learn the mapping information.

As mentioned, if necessary, an orientation and position of the circuit substrate 66 can be adjusted for aligning the circuit substrate 66 to reference field 76 for processing. For example, assembly position controller 52 can angularly rotate chuck 26 by 2 degrees around a respective chuck axis that is parallel to the Z axis to account for misalignment of circuits on substrate 66 on the chuck 26. Also, in other embodiments, assembly position controller 52 can initiate movement of assembly 56 in one or more of orthogonal X, Y, and Z axes (or even rotationally to achieve any possible orientation) for purposes of aligning, adjusting, or moving circuit substrate 66 in reference field 76.

In one embodiment, a planar surface of circuit substrate 66 on chuck 26 lies in an X-Y plane of laser processing system 36. Reference field 76 comprises a viewing region (e.g., potentially a volume of space or planar field) parallel to the X-Y axes as well. Typically, beam positioner 18 generates optical beam 44 substantially parallel to the Z axis. Focus capabilities associated with the beam positioner 18 and stage 22 can be used so that imaging system 48 detects positions of objects at depths in the Z direction.

The above technique discloses how laser processing system 36 can process a circuit substrate 66 to identify a relative position of contact pads 68 in reference field 76. Note that the above technique also can be used to align and process successive wafers received from wafer handler 20.

In addition to learning a position and orientation of the circuit substrate 66 and associated parts or components thereof, laser processing system 36 also supports detecting a position of probe pin elements 34 in reference field 76 (e.g., in an X, Y, Z coordinate system associated with laser processing system 36) for alignment of the probe pin elements 34 of a respective probe card 32 to contact pads 32 of circuit under test 70.

For example, after alignment (as will be discussed more particularly below), optical detection system 60 mounted to rigid frame 58 of assembly 56 can be used to detect respective positions of one or more probe pin elements 34 such as a first probe pin element at a first position (e.g., at a first corner) on the probe card 32 and a second probe pin element at a second position (e.g., at a second opposite corner) on the probe card 32 in the reference field 76. Aligning and contacting the first probe pin element to a respective contact pad and the second to a respective contact pad ensures that all other probe pin elements 34 of the probe card 32 are aligned and contact respective contact pads 72 of the circuit substrate 66 as long as the other probe pin elements 34 of the probe card 32 are not bent out of position and are planar (parallel to mounting features of) to probe card 32. Aligning two probe pin elements 34 to respective contact pads 72 of circuit under test 70 can provide sufficient accuracy and reducing the need to align and contact each and every probe pin element 34 to respective contact pads 72. As will be discussed, optical detection system 60 can view a position and orientation of probe pin elements 34 to determine whether the probe card 32 is damaged.

Note that one embodiment herein probe card 32 can be moved up and down in the Z axis.

Embodiments herein include utilizing imaging system 48 to view the reference field 76 from a first side (e.g., downward viewing of an X-Y plane of laser processing system 36 to image the patterned front side of the wafer) and detect the position of the contact pads 72 on circuit substrate 66 and utilizing probe viewing system 28 to view the reference field 76 from a second side (e.g., upward viewing of an X-Y plane of laser processing system 36 to image probe pin tips) and detect the position of probe pin elements 34 in the reference field 76. As shown in FIG. 3, one or more objective lenses (e.g., high magnification lens 64 and/or low magnification lens 62) and detector 78 (associated with optical detection system 60) are rigidly mounted to rigid frame 58 of assembly 56 that also carries chuck 26 and the circuit substrate 66.

Optical detection system 60 (e.g. probe viewing system 28) optionally includes light sources to illuminate objects in a respective field of viewing. In an alternative embodiment, an illumination source in beam positioner 18 or another illumination source illuminates the probe pin elements 34 from behind the probe pin elements 34 to the optical detection system 60. In the latter embodiment, respective high magnification objective 64 or low magnification objective 62 views a backlit silhouette of respective probe pin elements 34 on probe card 32.

Now, more particularly, detecting a position of probe pin elements 34 in reference field 76 involves first generating optical beam 44 that intersects a known reference position (e.g., a predetermined position) in reference field 76. Assembly position controller 52 then initiates movement of assembly 56 so that high magnification objective 64 of optical detection system 60 images the optical beam 44 in its field of view, (e.g. in the center of its field of view, onto detector 78, not shown). Optionally, low magnification objective 62 may image the optical beam 44 onto detector 78. In one embodiment, image processing system 50 provides an image of the optical beam 44 for viewing by an operator who manually controls positioning the assembly 56 into such a viewing position (e.g. so that it appears in the center of display screen 40). Alternatively, positioning the assembly 56 into such a viewing position is an automatic process performed under software control. In any case, the position of the optical beam 44 as imaged onto detector 78 is detected. The position of optical beam 44 or the position of assembly 56 can be also be recorded for later reference. Thus, detector 78 is aligned to reference field 76. This process (e.g., moving assembly 56) can be repeated for the same position of optical beam 44 in reference field 76 at different locations of assembly 56 to calibrate detector 78.

In one embodiment, beam positioner 18 generates an optical beam 44 that intersects one or more additional predetermined positions and the above process is repeated for each reference position of the optical beam 44. After completing this process, the camera (e.g., using high magnification objective 64 and/or low magnification objective 62 to image optical beam 44 onto the camera) associated with probe viewing system 28 is now aligned to reference field 76.

In one embodiment, beam positioner 18 generates an optical beam 44 that intersects a predetermined position and rigid frame 58 is moved in the z-axis to one or more positions. At each z-axis position of rigid frame 58, the optical beam 44 is imaged onto detector 78 and the size of the imaged spot through focus is detected. Based on the through focus images, a best focus z-position of chuck 26 can be determined. After completing this process, the detector (e.g., using high magnification objective 64 and/or low magnification objective 62 to image optical beam 44 onto the detector) associated with optical detection system 60 is now aligned to reference field 76 in the z-axis.

Consequently, assembly position controller 52 moves the assembly 56 and respective optical detection system 60 for viewing one or more probe pin elements 34 associated with probe card 32. Depending on how far the optical detection system 60 (based on movement of assembly 56) has to be moved (in X, Y, Z, or theta) to view a respective probe pin element 34, the position and orientation of the probe pin elements 34 in reference field 76 thus can be determined.

Different probe cards can be changed in and out of laser processing system 36. Thus, the exact position and orientation of probe pin elements in a newly mounted respective probe card may need to be learned each time there is a change of probe cards. One purpose of the low magnification objective 62 is to get an initial sense of where a probe pin element 34 lies in the reference field 76. If desired, laser processing system 36 can occasionally verify integrity of a probe card 32 and corresponding probe pin elements 34.

After alignment of the optical detection system 60, either or both of the high magnification objective 64 and the low magnification objective 62, after alignment, can be used to detect a position of probe pin elements 34 in reference field 76.

In one embodiment, the low magnification objective 62 is used to get a general sense of the location of probe pin elements in reference field 76. After finding one or more probe pin elements 34 on a probe card 32 with the low magnification objective 62, the high magnification objective 64 can then be used for increased resolution to more precisely determine or detect a position of the respective probe pin element 34 in the reference field 76.

As shown in FIG. 3, the high magnification objective 64, low magnification objective 62 and detector 78 are rigidly mounted on rigid frame 58 of the assembly 56 to provide upward viewing of objects in a direction along the Z axis. The high magnification objective 64 lies adjacent to the low magnification objective 62. Thus, as mentioned, after viewing a probe pin element 34 with the low magnification objective 62, the assembly position controller 52 can initiate movement of the assembly 56 so the upward viewing high magnification objective 64 views the same probe pin element 34 for a more precise determination of position in reference field 76.

As mentioned, during the viewing of a respective probe pin element 34, the computer system 38 (or other device such as assembly position controller 52) can track an amount of movement (in X, Y, and Z axes) of rigid frame 58 of assembly 56 to determine a position of a probe pin element 34 in the reference field 76. For example, a respective position of the assembly 56 is initially noted for each of the one or more optical beams 44 generated in reference field 76 to align optical detection system 60. After alignment, optical detection system 60 (and assembly 56) is positioned to view the probe pin element 34. The image processing system 50 then uses machine vision algorithms to identify a position of the probe pin elements 34 in the image of reference field 76.

Thus, by using the position of the detector 78 while viewing the probe pin element and the identified position of the probe pin element in the image of reference field 32, a position of the probe pin elements 34 can be determined with respect to the previously generated optical beam 44 at the one or more predetermined positions. Additionally, note that image processing techniques can be used to precisely identify a position of the respective probe pin element 34.

A respective focal plane associated with the high magnification objective 64 and the low magnification objective 62 can be adjusted (e.g., based on moving rigid assembly 58 up or down in the Z axis so that a respective probe pin element 34 (e.g. when viewed on display screen 40) appears in or out of focus. Alternately, probe card 32 can be adjusted up or down in the z-axis so that a respective probe pin element 34 (e.g.

when viewed on display screen 40) appears in or out of focus. Thus, a plane of best focus can be determine indication the relative position in the z-axis of probe pin element 34 relative to reference field 76. A z-axis position of probe card 32 is determined from the best focus plane for contacting probe pin element 34 to contact pad 72. Thus, the probe card 32 can be positioned so that the probe pin element 34 is at an appropriate contact height relative to reference field 76.

If desired, the optical detection system 60 can be used to image and detect a position of each and every probe pin element 34 associated with the probe card 32. The actual pattern produced by detecting the positions of probe pin elements 34 can be compared to an expected pattern that matches a footprint of contact pads 72 to determine whether any probe pin elements 34 are misaligned, missing or poorly imaged indicating that the probe card 32 is damaged.

As briefly mentioned above, an embodiment of optical detection system 60 can include a lighting system to illuminate contact surfaces of probe pin elements 34 associated with probe card 32 for viewing purposes. Such a lighting system in optical detection 60 can include components to illuminate a respective probe pin element 34 coaxially through the high magnification objective 64 and corresponding imaging optical path. Additionally, the lighting system of optical detection system 60 can include components to illuminate a respective probe pin element 34 with a ring light encircling the axis of the low magnification objective 62 and corresponding imaging optical path. The lighting system associated with optical detection system 60 will be discussed with more particularity in the following Figures.

As mentioned, in the context of applying optical detection system 60 to view one or more probe pin elements 34 of probe card 32, respective probe viewing system 28 forms an image of respective probe pin elements 34. In one embodiment, optical detection system 60 illuminates the probe pin elements 34 and forms an image using a telecentric objective lens having a numerical aperture of about 0.18 or more. In another embodiment, optical detection system 60 illuminates a probe pin element 34 with a ring light and forms an image with a 1× objective lens. Also, note that in an alternative embodiment, an auxiliary source on a same side of reference field 76 as beam positioner 18 can be used to illuminate the probe pin elements 34 in order to backlight probe pin elements 34 of probe card 32.

After completing the above alignment steps of determining a position of the probe pin elements 34 to circuits on substrate 66, laser processing system 36 initiates mating or contacting of the probe pin elements 34 and contact pads 72. For example, based on the detected position and/or orientation of the respective probe pin elements 34 and the determined position of contact pads 72 in reference field 76, assembly position controller 52 initiates movement of assembly 56 (e.g., along any or all of the X, Y, Z or theta axes) based on a positional difference or respective displacement of the devices (e.g., the probe card 32 and/or respective probe pin elements 34 as well as circuit under test 70 and/or respective contact pads 72) in order to align and initiate contact (e.g., electrical contact) between the probe pin elements 34 and the contact pads 72. Typically, a final movement of either the probe card 32 or the circuit substrate just prior to contact is roughly or substantially along the Z-axis to prevent damage to the probe card 32 and/or circuit substrate.

For example, in one embodiment, contacting the probe pin element 34 and the contact pads 72 of the circuit substrate 66 includes stepping the rigid frame 58 of assembly 56 so that the circuit substrate 66 moves in the X-Y plane of the reference field 76. Assembly position controller 52 initiates raising the circuit substrate 66 via movement of the chuck (e.g., wafer chuck) in a direction at least roughly parallel to the Z-axis. An amount that the chuck 26 needs to be raised in a direction along the Z-axis to move circuit substrate 66 into a laser trimmer processing plane or touch contact pads 72 with probe pin element 34 can be determined from a map of the height of the loaded wafer surface in relation to the reference field 76.

Mating of the probe pin elements 34 and the contact pads 72 can be achieved in other ways than initiating movement of assembly 56. For example, in an alternative embodiment, probe card position controller 74 initiates movement of probe card 32 (e.g., along the Z axis of laser processing system 36) so that probe pin elements 34 make contact with respective contact pads 72 on circuit substrate 66.

Note also that a combination of moving both the probe card 32 and the assembly 56 can be used to initiate alignment and contact of the probe pin elements 34 to contact pads 72. At a minimum, laser processing system 36 and corresponding controllers (e.g., assembly position controller 52 and probe card position controller 74) typically must support movement of either or both of probe card 32 and circuit substrate 66 along at least the Z axis (e.g., a direction substantially normal to the reference field 76) to properly contact the probe card 32 to the circuit substrate 66. As previously discussed, assembly position controller 52 can rotate the circuit substrate 66 based on calculating an angular value in which to rotate the circuit substrate 66 on chuck 26.

Note that although techniques herein disclose contacting one or more probe pin elements 34 to respective contact pads 72, techniques herein can be used to merely align objects or, more generally, learn a position of two or more objects present in a viewing region without initiating any movement of the objects for alignment purposes. Knowing a position of one object relative to another or even a position of single object (based on use of an on optical beam 44) is useful in many position-based applications.

In the sample embodiment discussed, contacting the probe pins of probe card 32 to contact pads 72 of circuit under test 70 creates respective electrical connections so that test equipment 54 can apply test signals (e.g., energy or power) to circuit substrate 66 and monitor characteristics associated with circuit under test 70. For example, alignment of probe card 32 and contact pads 72 of circuit under test 70 forms a contact or non- contact test interface enabling conveyance of a physical parameter from the device under test (e.g., circuit under test 70) to a measurement system associated with test equipment 54. The physical parameter can be electrical, optical, thermal, mechanical, magnetic, etc. Thus, principles herein can be extended to applications in which test equipment 54 applies different types of energy or signals such as electrical, optical, thermal, mechanical and magnetic to a corresponding a target object such as circuit substrate 66 on chuck 26.

In the context of a laser trimmer application in which beam positioner 18 emits optical beam 44 to trim circuit under test 70, as mentioned, a respective laser system 46 that trims circuit under test 70 also generates the optical reference beam for aligning the probe pin elements 34 of probe card 32 to the contact pads 72.

An energy level associated with the laser system 46 used to trim a circuit under test 70 of circuit substrate 66 can be substantially higher than a corresponding optical beam 44 used as a reference to align beam positioner 18 and probe viewing system 28 of laser processing system 36. Thus, in the context of a laser trimmer application according to an embodiment herein, the laser system 46 serves a dual purpose. That is, the laser system 46 and corresponding optical beam 44 supports both trimming as well as calibration and alignment purposes. According to such a configuration, there is no longer a need to include a physical fiducial reference in a respective probing type of system to achieve alignment as is required by conventional probe alignment methods. Instead, the optical beam 44 emitted by beam positioner 18 supports both laser trimming and pin-to-pad alignment.

As discussed above, certain embodiments herein include possible intervention by an operator to view images on display screen 40 and initiate movement of probe card 32, assembly 56 and/or optical beam 44 for purposes of aligning probe viewing system 28 to reference field 76.

An additional embodiment herein includes automated techniques in which laser processing system 36 initiates calibration and alignment without little or no human operator intervention. In other words, the process is automated via software. In such an embodiment, computer system 38 initiates steps of: i) loading a wafer such as circuit substrate 66 from wafer handler 20 onto chuck 26 of assembly 56; ii) positioning the circuit substrate 66 as well as probe card 32 in relation to a processing field (e.g., reference field 76) of the beam positioner 18; iii) contacting aligned probe pin elements 34 of the probe card 32 to corresponding contact pads 72 of the circuit substrate 66; iv) during probe-to-pad contact, utilizing beam positioner 18 to emit radiation from the laser system 46 and thereafter process (e.g., laser trim) a respective circuit under test 70 in the processing field; v) during probe-to-pad contact (either before, during, or after processing material associated with circuit under test 70), measuring a parameter value via associated with the circuit under test 70 via the test interface 54.

In a similar manner as the embodiments discussed above (potentially using operator intervention), the automated laser processing system 36 can include a beam positioner 18, and a probing system (e.g., probe card 32 and assembly 56 including corresponding components) in which either or both are rigidly coupled rigid frame 42. Utilizing the rigid frame 42 as a reference enables precise alignment of yet smaller and smaller contact pads and probe pin elements. In one embodiment, rigid frame 42 is an isolated structure mounted to system frame 10 via vibration isolators 14.

According to one embodiment, respective probe tips associated with probe card 32 have a dimension (e.g., diameter) of 20 microns or less, contact pads 72 have dimensions of 25 microns or less, and the probe pin elements 34 can be aligned within a tolerance of 4 microns in the X and Y axes. Probe pin elements 34 (e.g., probes on probe card 32) can be aligned to within 10 microns with respect to the Z axis of laser processing system 36.

As a variation on the above embodiment, circuit substrate 66 can be a wafer that is carried on tape in a tape frame and loaded onto the respective probing system of laser processing system 36 together with the tape and tape frame. In such an embodiment, the wafer carried on tape is a diced wafer.

To aid in the trimming of circuit substrate 66, laser processing system 36 can include one or more heating elements to heat circuit substrate 66. For example, the probing system of laser processing system 36 can includes a hot-chuck (e.g., chuck 26 with heating element (not shown)) for heating circuit under test 70 prior to laser processing.

Under certain circumstances, it has been observed that a single a 1.047-micron laser pulse can cause the output of a circuit under test 70 such as a digital-to-analog converter (DAC) to change level (out of a trim adjustment range) and cause a trim sequence to fail. In particular, pulse widths of 50 nano-seconds and laser spot sizes of 7 microns were utilized. This is believed to be a photo-electric effect. The effect was observed during trimming operations conducted at room temperature (26 C). Upon further investigation it was discovered that the temperature of the wafer/device directly affected the energy level at which the DAC output could be affected.

It has been discovered that by controlling the temperature of a device according to thermal sensitivity test data, the behavior of unwanted photo-electric disturbances can be influenced and minimized, allowing for the successful continuance and completion of the test and laser trim process. The wafer 66 is mounted and heated on hot-chuck 26 and a device 70 is irradiated with a focused pulsed laser beam. The pulse energy of the beam is set within a processing range for acceptable trimming while the temperature of the device 70 is controlled to reduce photo-electric effects, and the device 70 is trimmed to value. The temperature of the device 70 is controlled by a combination of the ambient temperature of the enclosure and the hot-chuck 26. Generally, the higher the temperature of the wafer/device, the higher the energy required to improperly affect device operation (e.g., to change level of a DAC circuit). At low temperatures such as 25 C, the wafer/device operation can be affected at energies as low as 0.5 ujoules. At 125C, device operation could not be affected even with pulse energy up to 2.2 ujoules.

Further Description of Various Embodiments

—Stage

In general, any type of movable assembly (e.g., high-speed stage) supporting precise positioning can be used as stage 22. In one embodiment, a high accuracy, hard bearing, integrated stage 22 driven by a multi-axis motion controller is used. In one embodiment, stage 22 supports the following performance parameters: X and Y step resolution of 0.02 microns, 250 ms step and settle time, position accuracy of approximately ±2.0 microns, repeatability of approximately 0.25 microns, Z position accuracy of 0.5 microns, and theta accuracy of 10 micro radians. For improved accuracy, a stage displacement error can be used to correct systematic position errors.

The chuck 26, mounted on the stage 22 is designed to bear a high combined probe force load without substantially deflecting the surface of the chuck 26. For example, in one embodiment, 10 pounds of total force at a 100 mm radius causes <5 microns chuck surface deflection.

—Probe Card

Probe card frame 30 associated with probe card 32 is mounted to at least one vertical motorized stage (which supports movement of the probe card 32 in the Z direction) and has a total possible travel of about 0.5 inches. The vertical motorized stage for moving probe card 32 is configured to set the height of a respective probe pin tip plane of the probe card 32 to a processing field height and to lift probe pins from the processing field. Preferably, the probe card frame 30 associated with probe card 32 is coupled to a second vertical motorized stage (which further supports movement of the probe card 32 in the Z direction).

In one embodiment, probe card frame 30 can accommodate different sizes of cards, such as widths between 4.5 and 12 or more inches. The cards can be manufactured from different types of material, made of different construction such as PCB (Printed Circuit Boards) and Membrane cards, and include different pin layouts and various types of probing pins. Generally the probe card frame 30 roughly aligns the probe pins, and may include fine alignment mechanics. Upon removal and reinsertion of different probe cards 32 in the probe card frame 30, displacement errors of respective probe pins can occur. Thus, each time a new probe card 32 is inserted into the probe card frame 30, the location of the respective probe pin tips must be precisely determined.

—Probe Viewing System

According to one embodiment, the probe viewing system 28 (as shown more particularly in FIGS. 4-7) is rigidly mounted on stage 22.

Figure 4:
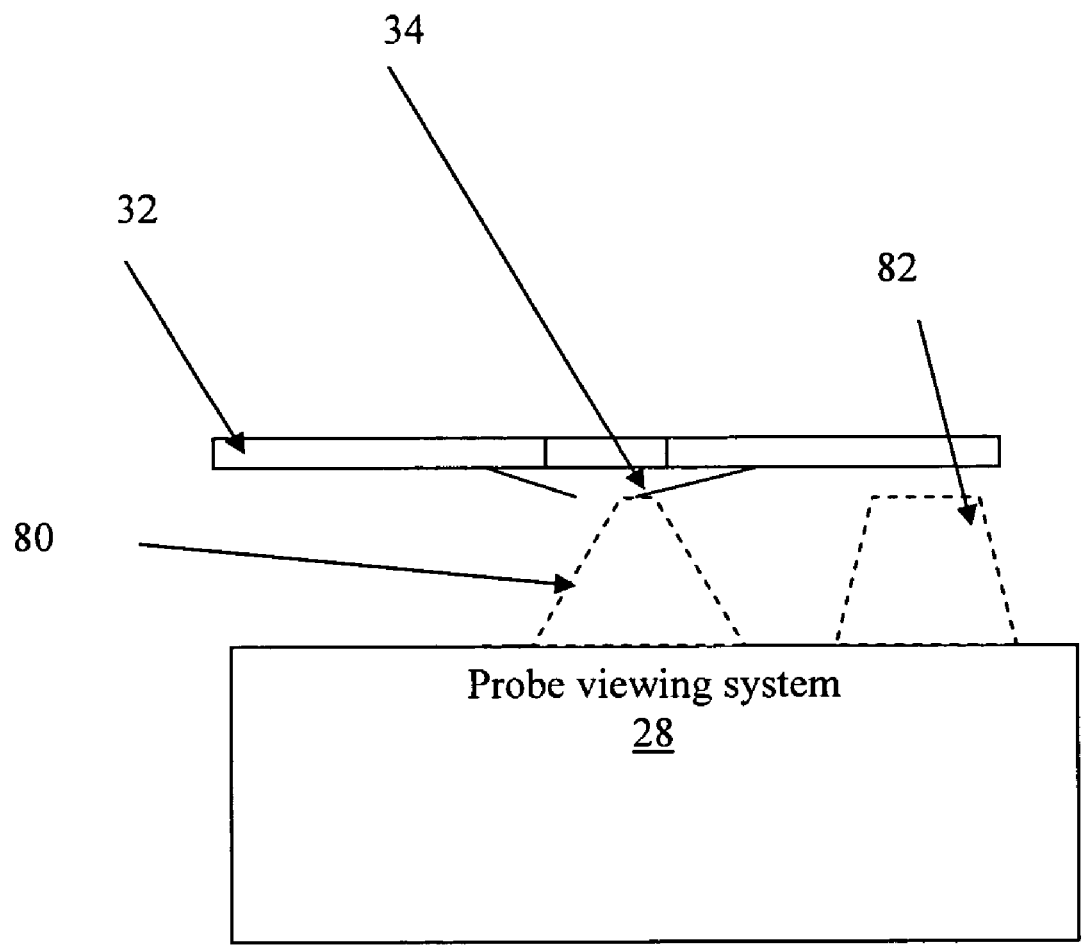
FIG. 4 is a diagram of a probe viewing system fields of view according to an embodiment herein.

Referring now to FIG. 4, the probe viewing system 28 can be translated in X, Y, Z space of the probing system 16 by movement of stage 22 (not shown) to position high magnification field of view 80 and/or low magnification field of view 82 to view an array of contact probe pins 34 associated with probe card 32 and generate an image of at least one probe pin 34.

Figure 5:
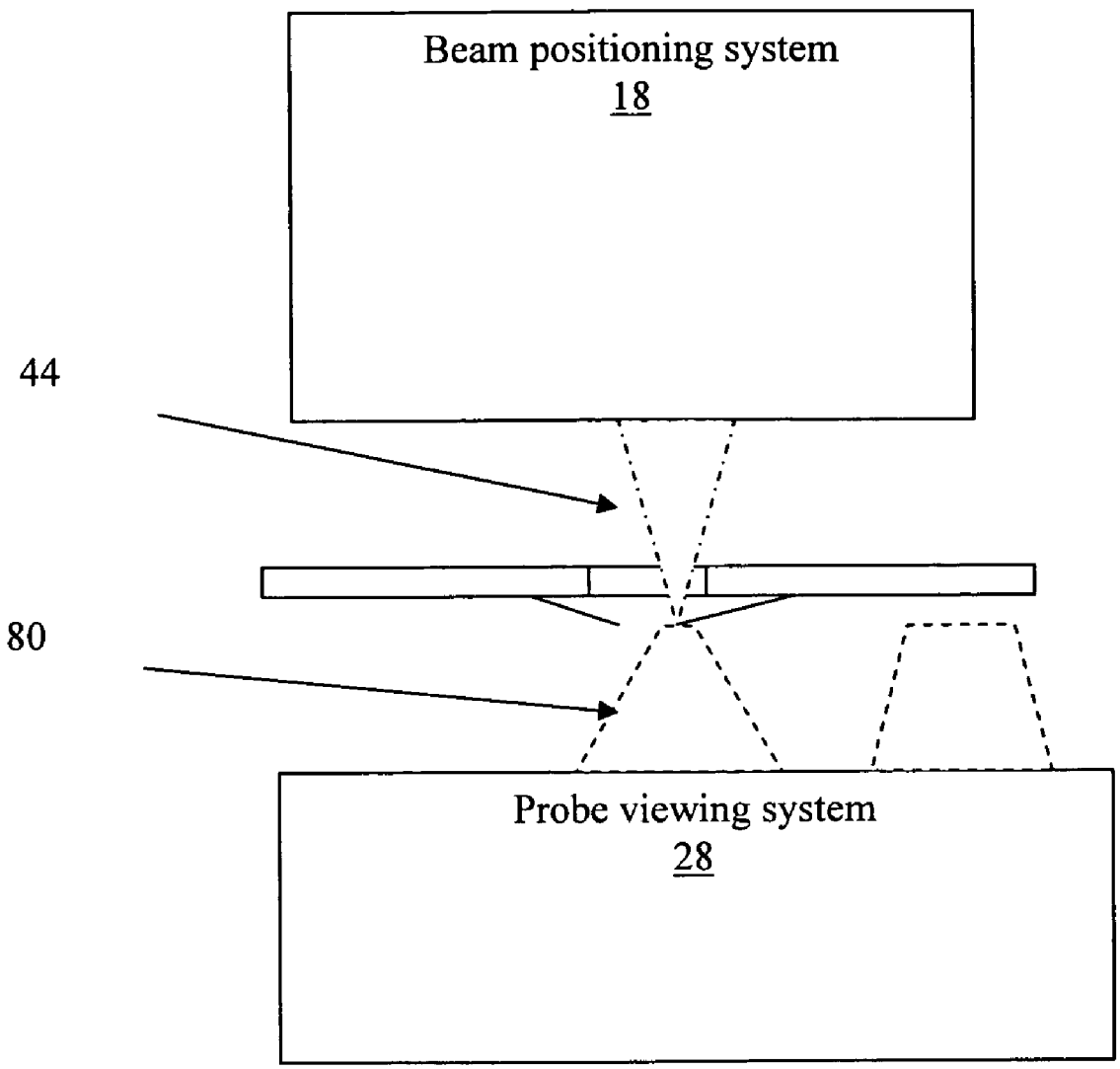
FIG. 5 is a diagram of a dynamic reference and probe viewing system according to an embodiment herein.

As shown in FIG. 5, the probe viewing system 28 detects radiation from an optical beam 44 such as a dynamic reference beam generated by beam positioner 18. The location of dynamic reference beam (e.g., optical beam 44) detected by probe viewing system 28 is a position reference that can be used to identify a location of objects in the field of view of probe viewing system 28.

Figure 6:
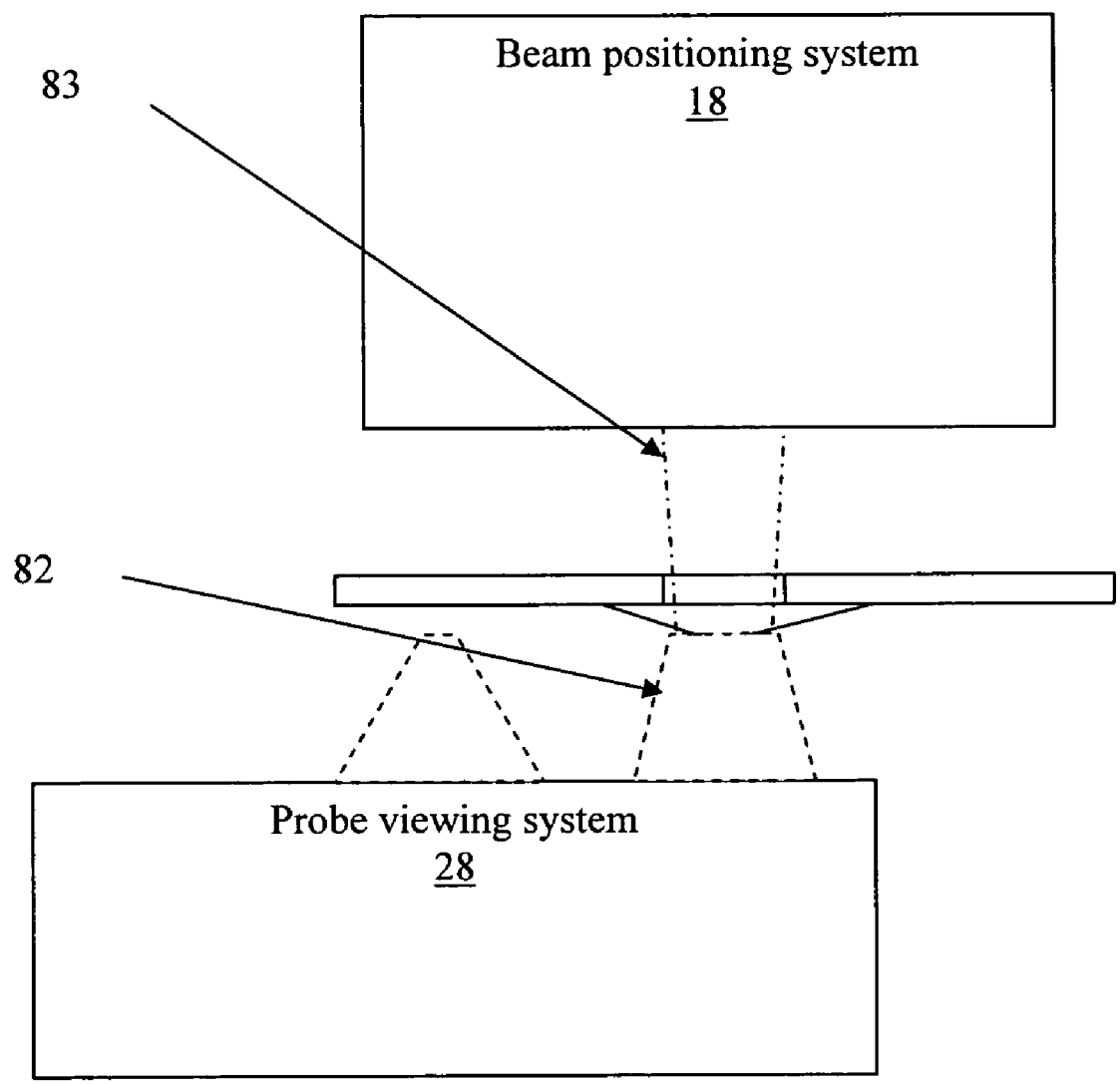
FIG. 6 is a diagram of a wafer viewing illuminator and probe viewing system according to an embodiment herein.

Referring to FIG. 6, a low magnification probe viewing path can be alternately illuminated with a coaxial illuminator (e.g., from beam positioner 18 or other light source in the vicinity of beam positioner 18) that is also used to view a respective wafer. In such a case, a coaxial illuminator becomes a backlight 83 to the probe pins 34 and creates a silhouette image of the probe pins on probe card 32. This silhouette image can be used to locate the position of the probe pin array.

In certain cases, the silhouette image of probe pins 34 on a probe card 32 will not show detail of corresponding probe pin tip surfaces. A backlit silhouette image can be combined with a front lit image. The level of the coaxial illuminator may be adjusted depending on a sensitivity of the probe viewing system 28.

Back lighting techniques can also be employed with high magnification probe pin viewing (FIG. 5). However, illumination levels for backlighting in such a case may be unsatisfactory. Furthermore, front side illumination (e.g., illumination from the same side as probe viewing system 28) can support more detailed imaging of object such as probe pin tip surfaces.

Figure 7:
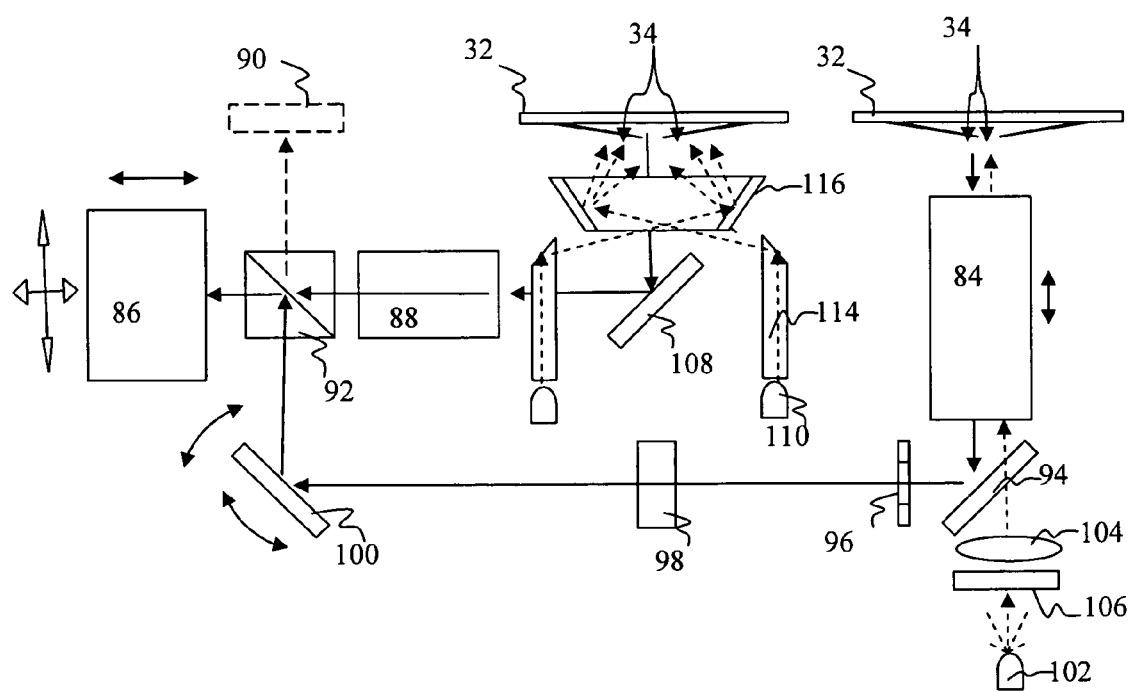
FIG. 7 is a diagram of a probe viewing system optical paths according to an embodiment herein.

Referring now to FIG. 7, the probe viewing system 28 according to one embodiment includes a high magnification objective lens 84 supporting a respective field of view 80 to view probe pin tips of probe card 32, a high magnification illuminator system illuminating the field of view 80, and an image detector (e.g., camera 86) configured to generate images based on objects in the field of view 80. Additionally, in one embodiment, the probe viewing system 28 includes a low magnification objective lens 88 supporting a respective field of view 82 to view probe pin tips of probe card 32, a low magnification illuminator system illuminating the field of view 82, and an image detector (e.g., camera 86) configured to generate images based on objects in the field of view 82.

The probe viewing system 28, as described above, includes respective high and low magnification optical paths and respective high and low magnification illuminator optical paths to image fields of view 82 and 80 respectively onto an image detector (e.g., camera 86) The high magnification path and low magnification path are more particularly described below.

In one embodiment, fields of view 82 and 80 are coplanar and are located several millimeters above a surface of the chuck 26. The stage 22 can initiate movement of the probe viewing system 28 to focus a respective field of view at the height of a laser trim processing plane or at other heights with respect to a laser trim processing plane associated with beam positioner 18. The probe viewing system 28 also can image at least one probe tip in a field of view 80 and at least a portion of the probe tip array in the field of view 82.

In one embodiment, the image detector is a camera 86 sensitive to both illuminator radiation and the radiation emitted from beam positioner 18 in optical beam 44. When the radiation of optical beam 44 is IR (Infrared), an IR sensitive CCD (Charge Coupled Device) camera 86 can be used to allow attenuation of the optical beam with a blocking filter to minimize potential damage to a detector associated with camera 86. In one embodiment, the camera 86 is a ½" detector having a compact housing.

In one embodiment, optional detector 90 sensitive to radiation in optical beam 44 and responsive to the position of optical beam 44 in reference field 76, for example a lateral effect photo-diode (LEP, PSD, etc.) or a split-cell detector (e.g. a bi-cell or quad-cell), is used in a detector optical path to detect the position of optical beam 44 in reference field 76. In this embodiment, a camera sensitive to illuminator radiation and with an imaging optical path aligned to the detector optical path images at least one probe pin tip in a field of view.

In at least one embodiment, a field of view of the camera 86 can be switched between high magnification and low magnification path by switching the states of the high magnification and low magnification illuminators. For example, for high magnification imaging, when the high magnification illuminator system is on, the low magnification illuminator is off. Conversely, for low magnification imaging, the low magnification illuminator is turned on and the high magnification illuminator is turned off.

In normal room lighting conditions, this arrangement can produce cross talk between the high and low magnification paths. However, when embedded in a dark system cabinet, the camera 86 works effectively. In one embodiment, fields of view 82 and 80 are sufficiently separated to limit cross talk from high magnification illumination to low magnification view and from low magnification illumination to high magnification viewing.

Both high and low magnification illuminators associated with probe viewing system 28 utilize 660 nm light sources such as switched LEDs (Light Emitting Diodes) configured to support simple beam combining. However, for some types of probe cards 32, other embodiments include use of different LEDs (for example, 660 nm and 525 nm LEDs for high and low magnification together with band-pass filtering) to further increase isolation. Each imaging path can include additional filters to block radiation from the other illuminator. Alternately, the cube beam splitter 92 can be a dichroic beam splitter to provide band pass isolation.

—High Magnification Path

Referring again to FIG. 7, an embodiment of the high magnification probe camera path is as follows. The field of view 80 is imaged on to the camera 86 with a 10× high magnification objective 84. The objective 84 can be a standard microscope objective, or for reduced size, can have a track length shorter than a standard microscope objective and may be constructed with commercially available elements such as achromats. Preferably, the high magnification objective 84 is a telecentric objective with a numerical aperture of about 0.18 or higher. The high numerical aperture provides a shallow depth of focus that can be used to accurately determine focus height. The high magnification path is folded with a plate beam splitter 94, passes through an aperture stop 96 and a blocking filter 98, is folded with a folding mirror 100 and finally with folded again with beam splitter 92.

Beam splitter 94 is used to coaxially illuminate the field of view 80 with light from an LED by transmission of light from source 102 through beam splitter 94 to produce coaxial illumination in field of view 80. Preferably, the source 102 (e.g., LED) is an ultra bright red LED at 660 nm, but could be any LED sufficient to illuminate the probe pin tip of probe card 32 for detection by the camera 86. Preferably, light from the LED source 102 is condensed with a condenser 104 and diffused with a diffuser 106 to provide bright uniform, high NA coaxial illumination.

In one embodiment, a fold mirror 100 is used for alignment of the high magnification image with the low magnification image. The beam splitter 92 is a cube beam splitter that combines the low magnification and the high magnification optical paths. The cube beam splitter 92 is preferably a non-polarizing type and can be a suitable dichroic type to increase efficiency when high magnification illumination and low magnification illumination operate at different wavelengths. The cube beam splitter 92 can have a split ratio other than 50% according to the efficiency of the high and low magnification paths. It is expected that sufficient illumination can be generated using a basic 50% non-polarizing beam splitter.

The high magnification optical path can include a blocking filter 98 to reduce an intensity of an optical beam 44 (e.g., a reference beam) emitted by beam positioner 18. When the reference optical beam 44 is from an IR laser, the blocking filter 98 can be a standard IR blocking filter. For other wavelengths, such as 532 nm, a laser line blocking filter or a dichroic can be used to sufficiently attenuate optical beam 44 without unacceptably decreasing imaging efficiency of probe viewing system 28. In one embodiment, a blocking filter can be permanently mounted in the camera 86. Many cameras already include an IR filter that may function as a blocking filter with IR lasers.

Attenuation of optical beam 44 can be achieved with one or more optical devices such as filters, apertures, partially transmitting optics, and diffractive devices at any point in a respective laser beam path from the laser system all the way to camera 86. In one embodiment, the laser generating optical beam 44 is attenuated with an AOM in the beam positioner 18 and a blocking filter in the probe viewing system 28.

—Low Magnification Path

As shown in FIG. 7, an embodiment of the low magnification probe camera path includes a fold mirror 108 and a 1× low magnification objective 88 that images the field of view 82 onto the camera 86. The 1× micro objective 88 can be a commercially available stock lens assembly. After the 1× objective 88, the low magnification path passes through the beam splitter 92, which combines the high and low magnification paths. Optionally, the fold mirror 88 is replaced with a third beam splitter and coaxial illuminator similar in construction to the high magnification illuminator.

In one embodiment, low magnification illuminator system includes a diffuse ring light encircling the low magnification axis. This is more particularly shown in FIGS. 8a-8d.

Referring to FIGS. 8a-8d, ring light system comprises an array of light sources 110 such as LEDs. Each light source 110 generates light 112 that couples to a respective light pipe 114 in a corresponding array of light pipes. Each light pipe 114 supports transmission in a cylindrical rod, and a bevel cut at the output end supports TIR (Total Internal Reflection). In one embodiment, the bevel cut is approximately 55 degrees.

Figure 8A:
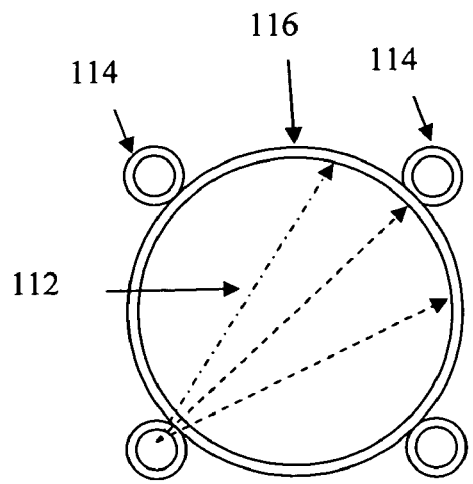
FIG. 8 (consisting of FIGS. 8a-8d) is a diagram of a ring light according to an embodiment herein.
Figure 8B:
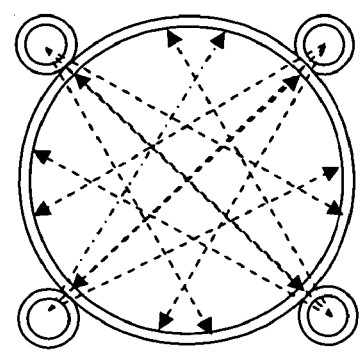
Figure 8C:
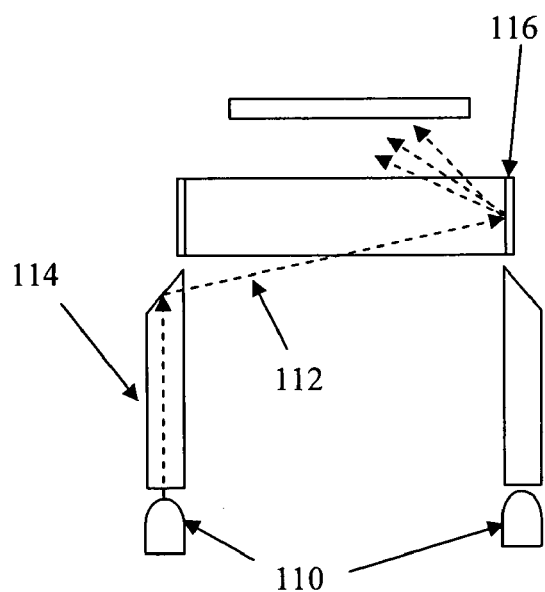
Figure 8D:
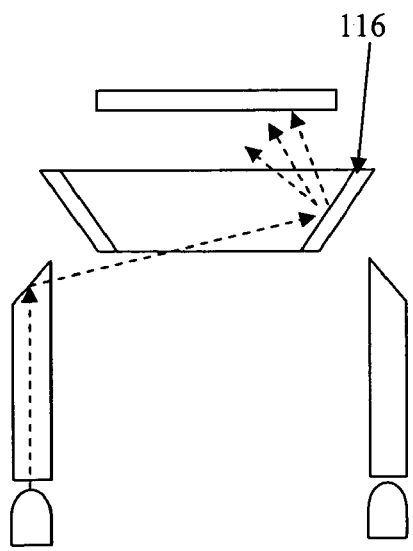

When light source 110 is on, light 112 exits from the cylindrical sidewall of each light pipe 114 propagating forward and transverse to the imaging axis toward a reflector 116. At the same time, light 112 exiting the light pipe 114 is diverged by the focal power of the light pipe sidewall. The diverging light from a respective light pipe 114 crosses the optical axis and illuminates a reflecting interior ring surface of diffuse deflector 116 with an elongated area. The ring surface may be a conically shaped as shown in FIG. 8d to generally deflect light toward a respective image field. Superposition of the array of diverging light beams uniformly illuminates the diffuse reflector ring 116. In one embodiment, the diffuse reflector ring 116 is at least partially diffuse to weakly scatter light 112 from the ring diffuser 116 to illuminate the low magnification viewing field. The reflective inner surface of diffuse reflector 116 can be made of a finished metal surface or an applied diffusely reflecting material such as an engineered, high efficiency diffusing reflective film or an inherently diffuse reflecting material.

—Beam Positioner System

Figure 9:
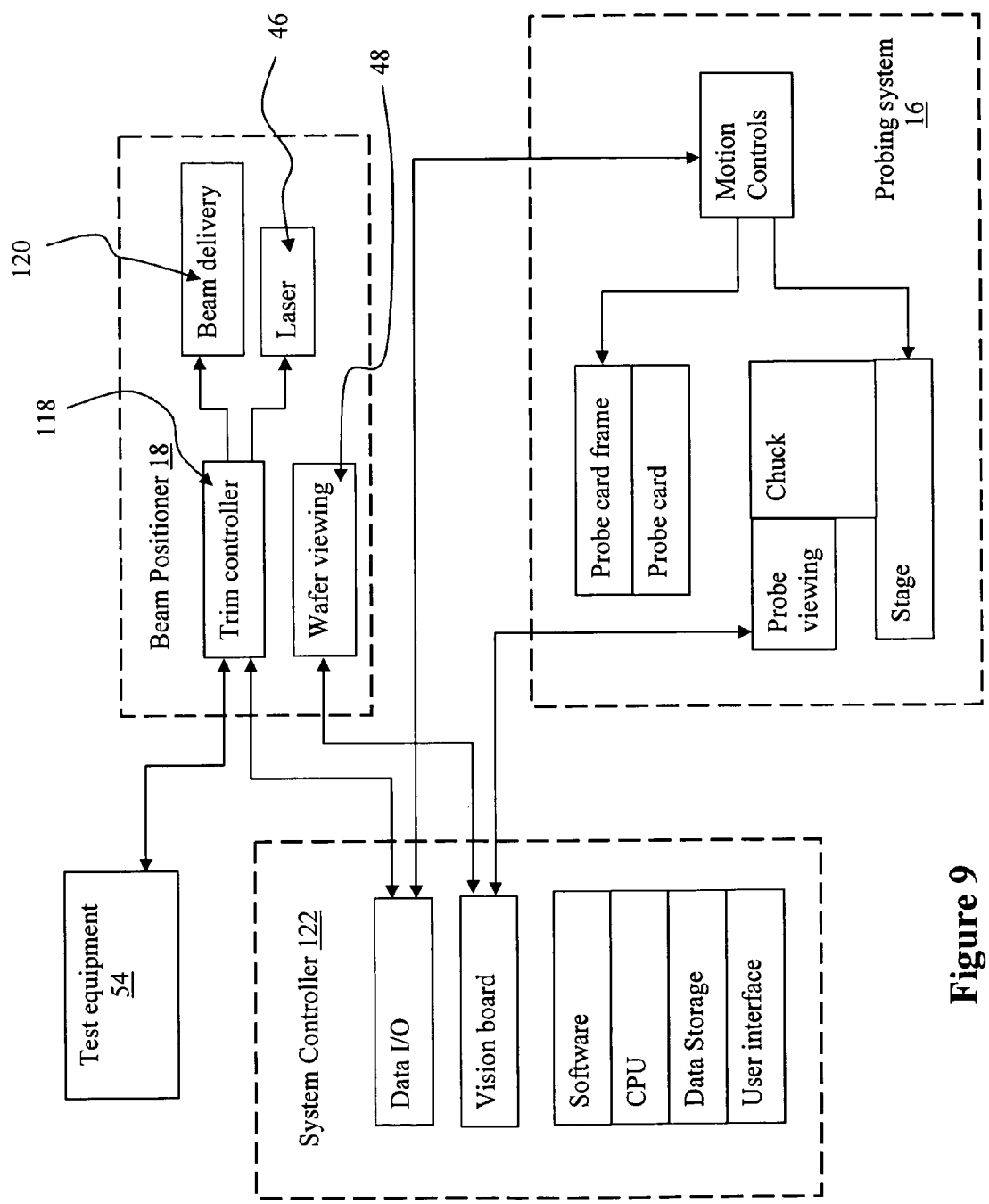
FIG. 9 is a diagram of a system schematic according to an embodiment herein.

Referring now to FIG. 9, in one embodiment the beam positioner 18 (e.g., beam positioner system 18) includes a trim controller 118, beam delivery optics 120, a system controller 122, imaging system 48 (wafer viewing optics and corresponding cameras), and a processing laser 46. In such an embodiment, several optical paths are directed to locations in a processing field of about 14 mm diameter. The optical paths include hi and low magnification wafer viewing, laser processing beam, and laser-eye edge finding systems, and a novel dynamic optical reference beam. Common elements to the optical paths are galvanometer scanners that direct the optical paths through a scan lens to the processing field. The laser, scanning functions, pulse control and timing are controlled by the trim controller 118.

The laser beam path from the beam positioner system 18 to the wafer mounted in the probing system 16 imposes various constraints that must be accommodated to accomplish both probing and laser trimming. For example, equipment placed between the target trimming area and the output aperture of the beam box can occlude portions of the laser beam and interfere with laser processing. For example, when a hot chuck is used to heat the wafer, a cylinder or cone may surround the output aperture of the scan lens, positive pressure in the cylinder or cone creating a flow of air to reduce the thermal effects of the hot chuck on the optical path. The size of the scan lens and working distance, as well as the specular nature of wafer substrates and thin film devices also constrain the ability to conveniently illuminate the target area (for example with a simple ring light or other commercially available machine vision illuminator). Conveniently, since wafer viewing is through the scan lens, the processing field and it is normally aligned with the probe array region can be viewed such that and detector or fiducial movement away from the processing field is not required. In one embodiment, the laser processing beam (e.g., from the laser source generating optical beam 44) can be directed by beam positioner 18 to target locations in order to modify material properties and trim device parameters associated with a respective wafer 24.

An optical beam emitted by beam positioner 18 (e.g. from the laser source generating optical beam 44 with other suitable levels of attenuation) can be scanned over reference feature edges. Reflected light is detected to precisely determine the position of an edge relative to the optical beam 44. In one embodiment, improved high speed edge scans are made with laser pulse rates >1 kHz of at least 5 to 10 kHz.

—Dynamic Reference Beam

As discussed, a novel feature of the beam positioner 18 is optical beam 44 that serves as a dynamic reference beam. A respective laser processing beam path can be attenuated with an attenuator in to generate optical beam 44. In one embodiment, the attenuator that attenuates optical beam 44 is an acousto-optic modulator located in the respective beam path. The dynamic reference beam emitted by beam positioner is generated from the same source the same as a laser processing beam for processing devices on wafer 24. The optical beam 44 used as a reference is more attenuated. According to one embodiment, a dynamic reference beam can be attenuated with non-deviating optical elements such as filters or pinholes in the laser beam path and/or in the probe viewing system 28. The dynamic reference is formed into an attenuated laser spot by respective beam delivery optics associated with the beam positioner 18.

Optical beam 44 (e.g., dynamic reference beam) is directed by the beam positioner 18 to a predetermined position in a respective reference field. Thereafter, the probe viewing system 28 is moved to a position a respective high magnification of view 80 or low magnification of view 82 to view the optical beam 44 at the predetermined position in the reference field.

In one embodiment, the predetermined position of the optical beam 44 is the center coordinate and current focus of beam positioner 18. The reference field can include at least a portion of the processing field and may be within the processing field or may exceed the processing field to some extent. The attenuated spot is imaged on the probe camera without damaging the camera and without excessive image disruption due to saturation effects in the camera. In one embodiment, the laser spot is imaged by the probe viewing system with the high magnification objective.

The dynamic reference is directed by the beam delivery optics to a reference location in the reference field and is imaged with the probe camera system. In one embodiment, the laser spot generated a respective laser system is imaged by the probe viewing system 28 with the high magnification objective 64. Focus and power of the laser spot can be adjusted to vary the imaged spot size and brightness. For example, the beam can be defocused by moving the stage 22 in the Z direction. Power of the optical beam 44 is optionally adjusted so that the imaged spot is approximately the same size and brightness as an imaged probe pin tip. In alternative embodiments, the spot size can be better focused and smaller at a respective lower power level.

An image is taken with the probe viewing system 28 of the probe pin tip. The location of at least one probe pin tip in the reference field is detected based on the position of the probe camera image of the dynamic reference spot at the reference location, the image of the probe pin tip and the respective positions of the probe viewing camera. The position of the probe pin tip is determined relative to at least one probe pin tip. In one embodiment, the dynamic reference laser spot can be imaged concurrently with other probe tips, in a single image. Additionally, probe tips can be viewed in different images generated by probe viewing system 28.

Multiple images of the dynamic reference (e.g., optical beam 44 at the predetermined position in a reference field) can be acquired at different focus heights, for example, by moving the stage 22 in the Z direction. Variations in the size of the imaged spot or the peak irradiance of the imaged spot through focus can be used to determine the height of the processing plane by locating the beam waist of the dynamic reference. For example, the height of the processing plane associated with beam positioner 18 can correspond to the smallest measured spot or highest peak irradiance of optical beam 44.

Alternately, a polynomial may be fit to data taken at a plurality of heights and the best focus determined. The spot size can be measured from an image by normalizing the peak irradiance and measuring a predetermine irradiance contour dimension, or by measuring an irradiance contour dimension relative to the peak irradiance. Likewise peak irradiance through focus may be determined by direct measurement or by the attenuation required to normalize the peak irradiance. Various algorithms can be used to provide speed and accuracy when locating the processing plane, for example a coarse focus may determine a reduced range of interest for fine focus.

The dynamic reference beam can be directed to any location within a reference field. In this way, regardless of the probe pin array pattern, the reference beam can be located in an un-obscured location in the probe pattern and avoid physical interference with the probes. The dynamic reference beam can also be directed to a plurality of locations and a plurality of positions can be determined relative to the field of view. The plurality of positions can be used to determine relative pin location or may be used to determine the relative reference field positions of the laser spot.

The stage can be driven to position the probe viewing system 28 in a respective field of view to encompass a plurality of portions of the reference field. The laser spot associated with the optical beam 44 can be directed to reference locations within the field of view. The position of the reference locations may be determined so that a plurality of positions is determined in more than one portion of the processing field. The plurality of positions may be used to determine reference field positions of the laser spot over a field larger than a probe viewing field. The plurality of positions can be used to determine reference field positions relative to stage positions.

Laser spot positions can be used to determine scale, rotation, skew, or distortion of one or more of the field of view, the stage motion, or the scan field.

—Wafer Viewing System

The beam positioner system 18 includes a "through the lens" wafer viewing system with high and low magnification cameras and a coaxial illuminator. The wafer viewing field position is correlated with the processing field to accommodate lens aberrations. Features of wafer 24 are imaged and the location of the features within the field of view is determined with the image processing system 50. The system controller 122 uses the position of the wafer features in the field of view, the position of the field of view in the processing field and the position of the stage to locate contact pads on the wafer relative to the processing field.

In order to illuminate the target area for through the lens viewing, a coaxial illuminator can be used, preferably a with narrow band illumination source such LEDs. The wavelength of LED may be near to the wavelength of the processing beam, for example 880 nm LEDs with a 1047 nm or 1064 nm processing beam. In some cases other LED wavelengths many be used, for example if alternate processing wavelengths such as 523 nm, 532 nm, 1.32 microns, 1.34 microns or other UV, visible or infrared wavelengths are used. Conveniently the coaxial illuminator may be within the range of sensitivity if the probe viewing camera.

—Vision Processor

Figure 10:
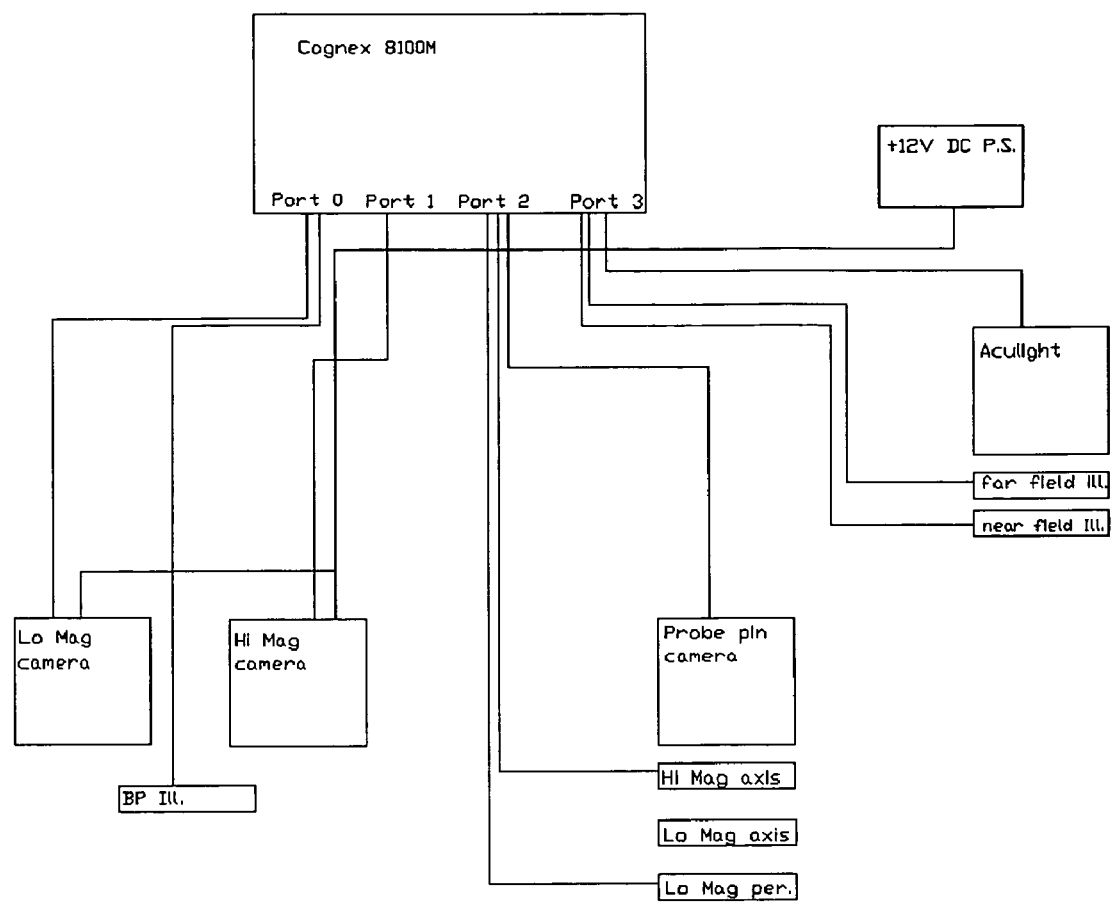
FIG. 10 is a diagram of a machine vision system schematic according to an embodiment herein.

Referring now to FIG. 10, the probe viewing system camera interfaces with a software-controlled vision processing board (e.g. image processing system 50). Preferably, the probe viewing and wafer viewing systems cameras as well as an optional OCR camera are controlled by a single vision processor, for example Cognex model 8100. Preferably the vision board can interface with 4 or more cameras.

High and low magnification probe viewing illuminators are controlled directly from a control board capable of switching between at least one high magnification and one low magnification illuminator. Preferably, the controller will also control illumination levels. Preferably, the same board provides controlled illumination intensities to a single beam box illuminator used by both Hi-Mag wafer and Lo-Mag wafer cameras. Preferably the board also controls the far and near field illumination on the optional OCR module. Most preferably, all cameras and illuminators are controlled by the same board.

The system may include 4 controlled cameras with the following functions; Hi magnification wafer, Lo magnification wafer, OCR, and Hi/low Probe. Preferably, all cameras are ½", BW CCD with approximately 768(h)×494(v) effective pixels.

Typical fields of view and illumination for all cameras are:

| System | Field type | Field size | Illumination |
|---|---|---|---|
| Beam positioner | Hi Mag wafer | 158 um × 118 um | IR LED 880 nm |
| Beam positioner | Low mag wafer | 1431 um × 1074 um | IR LED 880 nm |
| Prober viewing | Hi Mag probe | .48 mm × .64 mm | Red LED 650 nm |
| Probe viewing | Low mag probe | 4.8 mm × 6.4 mm | Red LED 650 nm |
| Handler | OCR | 25 mm | Amber-red LED 615 nm |

—Pad to Probe Alignment

The probe viewing system 28 positioned by the stage 22 provides images of both the probe tips and the dynamic reference from one side of the reference field. The wafer viewing system provides images of wafer features correlated to the calibrated processing field from the other side (e.g., beam positioner 18 side) of the reference field. According to one or more embodiments, the dynamic reference location in the reference field corresponding precisely to a location in the calibrated processing field is used to correlate the position of the probe pin tips and wafer contact pads in the reference field. Therefore, by using both probe pin viewing and wafer viewing together with a dynamic reference, the probe pin tips locations and probe pads are mutually aligned, and accurate pin to pad placement is made possible.

Accuracy of probe alignment depends in part on correlation of the dynamic reference position with a position of the "through the lens" wafer image. The edge finding system is used to scan edges of reference features to determine locations of the reference features in the processing field relative to the processing beam thereby calibrating the processing field. Edge locations are also found in the field of view of a wafer viewing camera with the vision processing system and position errors between the processing field and the wafer viewing field axis are determined. The wafer viewing field and processing field are then correlated to remove the position errors which may include chromatic aberrations in the scan lens resulting from illuminating and processing at different wavelengths.

More specifically, alignment features such as L-shaped alignment targets may be selected within a reference field that includes one or more devices (e.g. wafer die sites of in array, each with one or more associated alignment target). A group of several devices to be processed together forms a "reticle". Selected alignment features for each reticle are used to align the devices of the reticle for processing, for example, by scanning an attenuated processing beam over target edges and detecting reflected radiation or by using a machine vision system. Measurements based on alignment feature location may be used to correct for x and y offsets or theta rotation errors as needed to provide adequate alignment accuracy of the processing beam to each device in the reticle. Reticles may contain only device locations to be processed, or may be "partial reticles" containing a combination of device locations to be processed along with locations (device or non-device) that are not to be processed. Generally reticles in the center of a substrate, such as a silicon wafer, will contain only devices to be processed, whereas reticles near the edge may be partial reticles (e.g. reticles with nonfunctional die or empty locations at the wafer edge). Preferably, selection of alignment features within every reticle is automatic and is based on alignment strategy input, system accuracy, and the location of devices to be processed in each reticle. For example, a sufficient number of features are selected in each reticle to perform the alignment strategy (i.e. offset only, offset and theta, etc.) such that the alignment features are separated by a maximum distance (for accuracy) and partial reticle are accommodated by selecting alignment features only from the devices to be processed.

Pad locations are either known or learned for a device on a substrate. Multiple similar devices may be arrayed on the substrate in know positions relative to substrate reference features. Therefore, pad locations for any device in know fixed arrays on a substrate can be determined in relation to the wafer alignment features. Probes can be aligned to pads of a single device, a portion of a device or multiple devices within the reference field. The wafer alignment feature can be any feature that can be detected and trained to a vision template. Generally, alignment of the substrate is sufficient, to determine the location of all pads on a substrate, however when device locations are not in a know array or are not in a fixed array, and in other cases it may be necessary to align each device individually with fixed reference features on each device for sufficient accuracy. For example, positions of diced carried wafers on tape may not be precisely known, and may be individually aligned.

An optional machine vision focus routine may be used to accommodate wafers of varying thickness and provide a corrected Z focus position for each loaded wafer. The wafer is stepped in the Z axis, and a focus value of the wafer image is measured, compared with a previous value, and stored for each Z step. If the focus values are determined to be decreasing and a maximum value has not been identified, the Z position is reset to the starting value and stepping is continued in the opposite direction. After a maximum focus value has been identified and based on interpolation of the stored focus values, a best focus Z position is determined. Conveniently, the size of the Z step may be set large enough to limit the number of steps needed to a relatively small number of steps thereby improving system throughput, while at the same time set small enough to ensure that at least one focus step will be close enough the best focus position to maintain system accuracy.

The mounted wafer may be optionally centered by determining three wafer edge points based on wafer images and a machine vision model of the wafer edge. Initially, a low resolution search routine may be used to find the three edge positions that are orthogonal to (and excluding) the wafer notch position. Alternate positions up to about 15 degrees from starting search positions may be used. The search may proceed radially outward at each position until the wafer edge location is reliable determined, for example by eliminating any targets toward the wafer center that may resemble the outer wafer edge. Based on the three edge points, center position and diameter of the wafer is determined and used to accurately locate wafer alignment features. By reducing errors in the position of alignment features within a wafer image, machine vision alignment speed to the features is improved. The machine vision system may use vision templates based on wafer features, alignment die features or processable die features to determine feature locations and orientations precisely align an array for processing.

—Trim Controller

The trim controller 118 of the trim and test system is primarily responsible to move galvanometers associated with the beam positioner 18 in the XY plane. In one case, the galvanometers are positioned to a new location in as little time as possible. Often, this is done, because the galvanometers are moved to a new trim start location, or because the user would like to look at the die's features at the specified location. In another case, the galvanometers travel along a trajectory at a constant speed. Typical trajectories are straight lines, which are segments of trims or die alignment scans. During trims the controller generates handshake signals linking the controller to an external tester which may terminate the on-going trim.

One function of the trim controller 118 is the scanning of targets located on the die. The controller will scan an attenuated laser spot along a line while acquiring data from reflected energy with photo detector. The scan is performed at a constant velocity in order to collect equidistant data points at a fixed sample rate. The acquired signal is analyzed for one or more transitions in order to determine the actual location of an expected feature on the die (i.e. a trace).

The trim controller 118 generates position signals for the galvanometers for quick movement of the beams emitted from beam positioner 18 from one location to another, as well as for movement of the emitted beams at constant velocities for trims and die alignments. For trims, the trim controller 118 monitors and generates handshaking signals to the tester. For die alignments, the trim controller 118 generates a sample clock for the photo-detectors, and reads and processes acquired signals. Lastly, the trim controller 118 produces the laser trigger pulse and set the AOM appropriately during trim, target scan, or link blasting.

—System Control

The system controller 122 runs the trimming process to align and contact probe pins to wafer pads, to position devices within the processing field, and process device elements by directing the processing beam to locations within the processing field. The system controller 122 sends and receives signals from the probing system 16, the beam positioner 18 and the measurement system 54. The system controller 122 is best understood by considering the trimming sequence it executes.

—Setup

Figure 11:
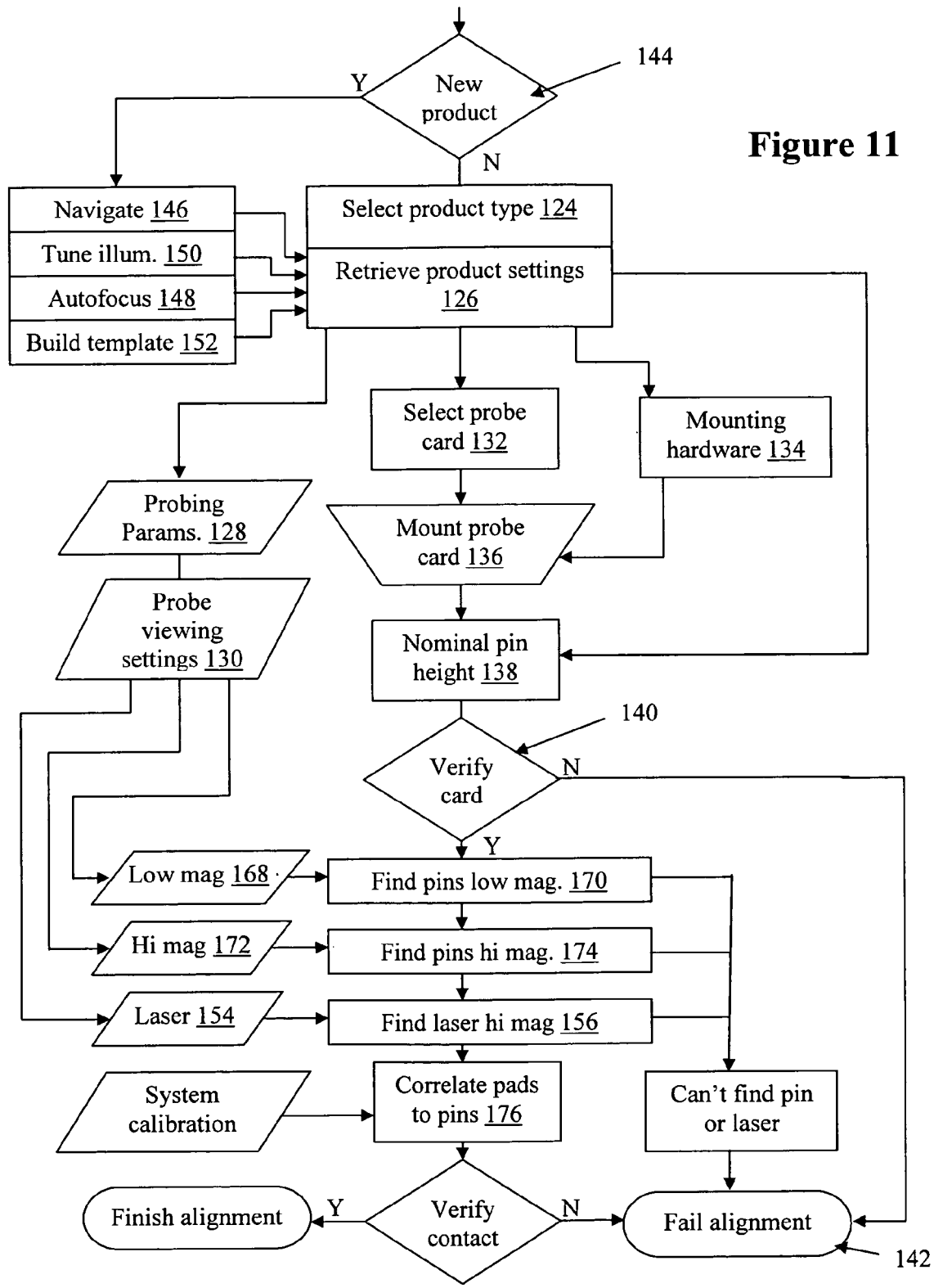
FIG. 11 is a diagram illustrating an automated alignment process according to an embodiment herein.

Referring to FIG. 11, for a known product, a product type is selected at step 124 and product settings are retrieved at step 126. The product settings may include probing parameters 128 and probe viewing settings 130 such as probe tip pattern information, reference location positions, illuminator settings and laser settings. At steps 132 and 134, a probe card and associated mounting hardware (such as mounting rails etc. if any) are identified with an optional nominal probe frame height and probing parameters corresponding to the probe card for aligning the probe card. For a system processing many types of devices, the selection process may be partially or fully automated so that based on the device type input, the system will identify the card and mounting hardware. At step 136, the probe card is mounted in the probe card frame, and optionally at step 138 the frame is driven to the nominal height.

After inserting the probe card and before probing and processing any devices, at step 140 the system may verify with the vision system that the pin array is recognized and that the array corresponds to the correct probe card. Alternately, probe card identification marks (e.g. alphanumeric strings, barcodes, etc.) may be read or scanned at any time to verify the card type. If the probe card cannot be verified, then alignment has failed as indicated at 142. The probe pins may be further inspected for damage and contamination prior to final alignment. Probe pin inspection may by direct inspection or inspection of hi or low magnification probe viewing images.

When the product is a new unlearned product such as shown at step 144, the operator will acquire probing parameters in a learning sequence. The sequence includes loading a new wafer, navigating to an alignment target area 146, performing an auto focus 148, tuning the illumination 150, and defining an alignment target. The vision system then builds an optimized template of the alignment target 152. In addition, probe pad locations can be learned by aligning the wafer to the alignment targets and then moving the stage and the wafer viewing field of view to include one or more pads. Each pad is aligned in the field of view and the locations of the pads are stored. The stored learned pad locations may be used to determine desired pin tip locations. Probing parameters are stored and the operator proceeds with automated probe alignment.

—Probe Alignment

At step 154, the processing laser is attenuated to a low power dynamic reference beam with an acousto-optic modulator. It is directed to a reference location in reference field. At step 156, the wafer stage positions the high magnification field of view 80 to include the reference location. The focus height relative to the wafer chuck may be reset. The camera takes an image of the laser spot and the position of the reference location in the field of view is determined. The step of acquiring an image of the laser spot may be combined with the step of acquiring an image of a reference pin tip by taking an image including both the pin tip and the laser spot and determining the location of the pin and the laser spot in a single image.

At step 168, the low magnification illuminator is configured to illuminate the low magnification field of view according to the probing parameters. At step 170, the wafer stage positions the 4.8 mm×6.4 mm low magnification image field of view to include at least a portion of the probe pin tip array and an image of the field of view is taken. The position of one or more probe pin tips is determined based on the low magnification image and accordingly, the location and orientation of the probe tip array is determined. The relative height of the camera and the probe tips may be iteratively adjusted and the image may be retaken to obtain a focused image. The pattern of probe pins may be compared with reference data to determine if the pattern matches the desired pattern. The comparison may also identify potential damage to the probe pin array by finding pin tips that are out of position.

In some cases when the probe pins are initially located in the probe card frame with sufficient accuracy, the step of determining a pin tip position in the low magnification field of view may not be required. In this case, a probe tip can reliably be positioned in the high magnification field of view, or a search strategy is used to find a nearby pin tip.

At step 172, the high magnification illuminator is configured according to the probing parameters to illuminate the high magnification field of view. At step 174, the wafer stage positions the probe camera system so that the 0.48 mm×0.64 mm high magnification image field of view includes at least one probe pin tip. The probe camera system may be displaced in the Z axis relative to the probe pin tip and the height of the probe pin tip may be determined from a plurality of images of the probe pin tip. One or more images of at least one probe pin tip are taken and the position of a probe pin tip is detected from the high magnification image.

A second probe tip may be imaged and located with the high magnification objective and theta orientation of the probe tip array may be precisely determined. A third probe tip may be imaged and located with the high magnification objective and a coincident plane of at least 3 probe tips may be determined. A plurality of probe tips may be imaged with the high magnification objective and a best fit position orientation and plane may be determined (step 176).

—Trim Processing

It may be desirable during processing to repeat some probe alignment steps, for example acquiring an image of the probe tip, acquiring an image of the laser spot or acquiring an image if the probe tip array. These steps may be repeated to increase accuracy or to inspect for contamination or damage.

In operation, the trimming system may include an optional wafer handler. The wafer handler includes a robot to load and unload wafer from carriers. Various stations in the handler many include wafer pre-align and optical character recognition (OCR) to identify and locate the wafer prior to robotic loading into the trimmer. The wafer handler may handle bare wafers or wafers mounted in tape frames. Wafer in tape frames may be thinned and or diced.

Figure 12:
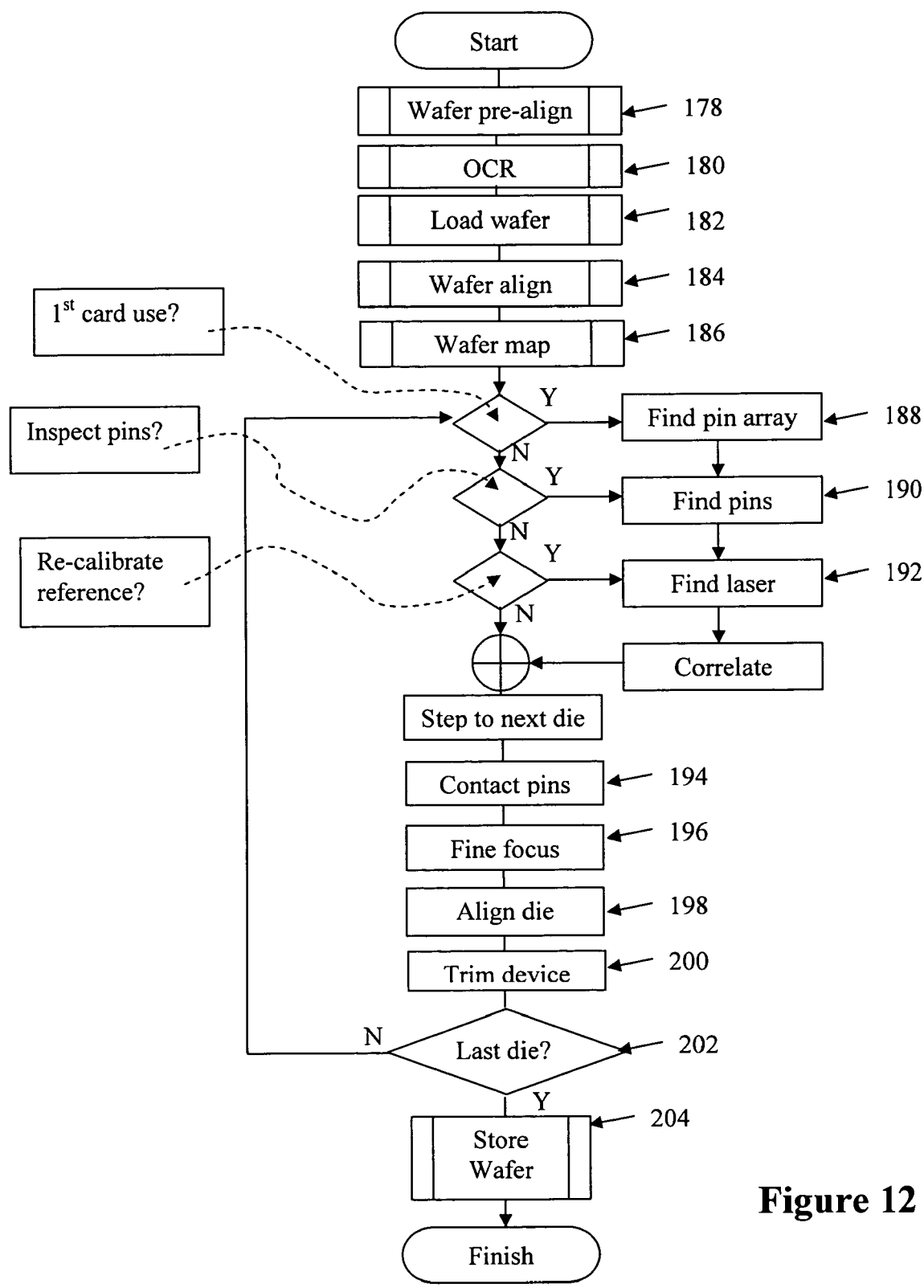
FIG. 12 is a diagram of a trim process with automated probe alignment according to an embodiment herein.

Referring now to FIG. 12, at step 178 a wafer is loaded on a pre-aligner to pre align the wafer and then at step 180 OCR is performed. At step 182, the wafer is then loaded on the wafer chuck and the stage positions the wafer so that at least one reference feature on the wafer is positioned within the reference field. An image of the reference feature is taken with wafer viewing system. The stage may position the wafer so that at least one other reference feature on the wafer is positioned within the reference field and an image of the at least one other reference feature is taken with wafer viewing system. At step 184, the wafer is aligned with the positions of the contact pads relative to the processing field determined based on the position of the one or more reference feature positions in the wafer viewing field. The aligned contact pad positions may include x, y, z and theta positions.

At step 186, a wafer map may be generated by positioning the wafer at 3 or more reference locations and obtaining z height data at the locations. Then a plane or a focal surface is fit to the z height data to create a wafer map of z height. The position in z of a device to be processed may determined from the location of the device and the wafer map.

The focus map may be generated using a polynomial fit based on height (z-axis) measurements of device reference features at selected sites on the substrate. The measurements may be based on laser edge scanning techniques or on machine vision focus routines. At least 5 sites are selected to be measured, but any number of sites up to the total number of devices (e.g. total dice per wafer) may be measured. Accuracy may be increased with an increased number of measurements; however the associated time increase required may adversely affect system throughput. When 5 sites are selected, the locations are preferably 2 sites toward the end points of each of the x and the y axes plus one site near the center of the substrate. Generally sites are selected based on accuracy requirements although other site locations may be used. Equation 1 consisting of an offset, a linear term for X and Y, and the square addition and subtraction of X and Y is used for the polynomial fit with 5 sites as follows:

$$z = c_0 + c_1 \cdot x + c_2 \cdot y + c_3 \cdot \sqrt{x^2 + y^2} + c_4 \cdot (x^2 - y^2) \qquad 1:$$

When 7 sites are selected, the sites may be, for example, 6 sites around the perimeter of the substrate plus on near the center and Equation 2 consisting of an offset, a linear and square term for X and Y, the square addition of X and Y, and the cross product of X and Y is used for the polynomial fit as follows.

$$z = c_0 + c_1 \cdot x + c_2 \cdot y + c_3 \cdot \sqrt{x^2 + y^2} + c_4 \cdot x^2 + c_5 \cdot y^2 + c_6 \cdot x \cdot y. \qquad 2:$$

With 6 sites or with more than 7 sites, equations 1 or 2 may be used with standard techniques to accommodate the surplus measured data. For example, when 6 sites are selected, the measured data and equation 1 is used with a least squared fit method. Likewise, for 8 or more selected sites, the measured data and equation 2 is used with a least squared fit method.

While a polynomial fit is preferred for non-linear topologies, one may employ a conventional linear fit to each of four quadrants defined by measurements at the substrate center and each end point of the x and y axes. Higher order polynomial terms may also be used; however increased site measurements may be needed to provide sufficient data and to limit the calculated height within permissible error limits. Generally, equations 1 and 2 can provide sufficient accuracy for loaded substrates with surfaces that deviate from a flat plane by small amounts having low spatial order (e.g. spherical cylindrical etc.).

Referring again to FIG. 12, optional steps 188-192 may be performed to re-find the probe pin array, individual pins, or the laser spot to improve accuracy, compensate for drift or to check for pin wear, contamination or damage.

To process the wafer, at step 194 the wafer stage aligns a first set of contact pads to the aligned probe pins and the wafer chuck is raised to bring the wafer surface into focus and to engage the contact pins and pads.

At steps 196 and 198, die fine focus and alignment are preformed using laser edge scanning to determine and correct residual position errors.

At step 200, the die is trimmed. Processing parameters are set by the controller including trim cut geometry and bit-size, laser q-rate, and pulse energy. The laser parameters are to be understood as parameters of any laser for processing device elements by irradiating a portion of the device while contact pads associated with the device are contacted by one or more probe pin tips which have been automatically aligned using a dynamic reference beam. For example the laser may be UV, visible or IR, and the pulse width may be several femtoseconds, picoseconds to several hundred nanoseconds at pulse rates from about 1 kilohertz to several hundred megahertz or more in single pulse or burst pulse modes. With a wavelength of 1047 or 1064 nm, the laser spot size may be as small as about 4.5 microns. With wavelength of 532 nm or 523 nm the spot size may less than 4.5 micron and may be as small as about 2.3 microns. With wavelength of 405 nm the spot size may less than 4.5 micron and may be as small as about 2 microns. Pulse energy may further set according to a parameter of any one segment of a trim which may be a coarse, fine or intermediate trim parameter.

The processing parameters may further include a time interval for measuring laser output with a photo-detector. The time interval may be predetermined or may be derived from a sequence of measurements or iterative measurements and statistical analysis. During the time interval, at least one measured photo-detector value is stored and the stored value used to set output energy in 2 or more trim cuts. Measurement overhead time associated with at least one photo-detector measurement is reduced or eliminated during the time interval. After the time interval and before a subsequent trim cut the stored value is updated with one of a recently measured value or a retrieved value. When a retrieved value it used, it may be derived from a model, taken from a representative table of values, or may be a value associated with other process parameters (e.g. optimized energy values for coarse and fine trimming). The model or table may be based on theory or compiled measurements and may compensate for measured, calculated, or characteristic pulse energy drift. It is to be understood that the time interval is set to improve system throughput by eliminating measurements that are not required to maintain the pulse energy within a predetermined range and to provide efficient optimized pulse energy control.

Using the pulse energy set by the AOM attenuation, at step 200 at least one element of a device is processed with the processing beam until trimming is stopped. The contact pins and pads are disengaged, the wafer is stepped, and a second set of contact pads are aligned to the aligned probe pins. Contacting, processing and stepping are repeated (indicated by step 202). When processing is complete, at step 204 the wafer is unloaded from the wafer chuck and stored.

Those skilled in the art will understand that there can be many variations made to the operations of the laser processing system explained above while still achieving the same objectives of the invention. Such variations are intended to be covered by the scope of this invention. As such, the foregoing description of embodiments of the invention are not intended to be limiting. Rather, any limitations to embodiments of the invention are presented in the following claims.

What is claimed is:

1. A method, comprising:
    positioning a wafer-based device in a reference field;
    determining a relative position of a second element in the reference field, the second element being a device interface element of the wafer-based device;
    generating an optical reference beam that intersects a predetermined position in the reference field, including:
        generating a laser processing beam and propagating the laser beam along an optical path that intersects the reference field; and
        attenuating the laser processing beam;
    detecting a relative position of a first element in the reference field, the first element being a probe element; and
    aligning the first element to the second element, including aligning the device interface element within the reference field to the probe element based on the detected position of the probe element in the reference field and the determined position of the device interface element, and
    processing material of the wafer-based device with the laser processing beam;
    wherein determining the relative position of the device interface element to the reference field further comprises:
        detecting a position of reference features carried with the device interface element with respect to the reference field, and
        determining the position of the device interface element based on the position of the detected reference features and a predetermined position of the device interface element with respect to the reference feature;
    and wherein a predetermined position of the device interface element with respect to the reference feature is one of:

the position of the device interface element in a map of a wafer including both reference feature positions and device interface element positions, or a position of a device interface element measured in relation to a reference feature;

and wherein determining the position of the device interface element based on the position of the detected reference features and a predetermined position of the device interface element with respect to the reference feature includes:

utilizing a first camera with at least one field of view positioned in the reference field to detect the position of the reference features carried with the device interface element in the reference field;

and wherein detecting the position of the probe element in the reference field with respect to the position of the optical reference beam includes:

i) positioning the optical reference beam at a predetermined location in the reference field;

ii) positioning a field of view of a second camera within the reference field;

iii) forming an image of the optical reference beam in the field of view while the optical reference beam is at the predetermined location in the reference field;

iv) forming an image of one or more tips of probe pins associated with a probe card in the field of view, the probe element being one of the one or more probe pins;

v) determining the position of the image of the optical reference beam in the field of view; and vi) determining the position of at least one probe pin tip in the field of view.

2. A method, comprising:

positioning a wafer-based device in a reference field;

determining a relative position of a second element in the reference field, the second element being a device interface element of the wafer-based device;

generating an optical reference beam that intersects a predetermined position in the reference field, including:

generating a laser processing beam and propagating the laser beam along an optical path that intersects the reference field; and attenuating the laser processing beam;

detecting a relative position of a first element in the reference field, the first element being a probe element; and aligning the first element to the second element, including aligning the device interface element within the reference field to the probe element based on the detected position of the probe element in the reference field and the determined position of the device interface element, and processing material of the wafer-based device with the laser processing beam;

wherein:

determining the relative position of the device interface element to the reference field includes utilizing a first imaging system viewing the reference features from a first side of the reference field to determine the position in the reference field of reference features carried on a device substrate; and detecting the position of the probe element in the reference field with respect to the position of the optical reference beam includes utilizing a second imaging system viewing the probe element in the reference field from a second side of the reference field to detect the position of the probe element in the reference field, the second imaging system being rigidly mounted to a movable assembly that carries the substrate upon which the device interface element and reference features reside, and wherein the second side of the reference field is the reverse side of the first side of the reference field.

3. A method as in claim 2, wherein utilizing a second imaging system to detect the relative position of the probe element in the reference field includes initiating movement of the movable assembly to position the second imaging system for imaging the probe element, and wherein the method further comprises:

moving the movable assembly to a predetermined position to position a field of view of the second imaging system in the reference field;

imaging a probe element in the reference field and based on the image; and determining the position of the probe element in the reference field.

4. A method, comprising:

positioning a wafer-based device in a reference field;

determining a relative position of a second element in the reference field, the second element being a device interface element of the wafer-based device;

generating an optical reference beam that intersects a predetermined position in the reference field, including:

generating a laser processing beam and propagating the laser beam along an optical path that intersects the reference field; and attenuating the laser processing beam;

detecting a relative position of a first element in the reference field, the first element being a probe element; and aligning the first element to the second element, including aligning the device interface element within the reference field to the probe element based on the detected position of the probe element in the reference field and the determined position of the device interface element, and processing material of the wafer-based device with the laser processing beam;

wherein detecting the position of the probe element in the reference field is with respect to the position of the optical reference beam and includes utilizing an imaging system including at least one camera and high and low magnification imaging elements rigidly mounted to a movable assembly to detect the relative position of the probing element in the reference field, the movable assembly carrying a substrate upon which the device interface element resides, and wherein the method further comprises:

initiating movement of the movable assembly to view the probe element with the low magnification imaging elements; and initiating movement of the movable assembly based on a low magnification image to view the probe element with the high magnification imaging elements, the high magnification imaging elements being rigidly mounted adjacent to the low magnification imaging elements.

5. A method as in claim 4, further comprising:

illuminating the probe element coaxially through the high magnification imaging element; and illuminating the probe element with a ring light encircling the axis of the low magnification imaging optical path.

6. A method, comprising:

positioning a wafer-based device in a reference field;

determining a relative position of a second element in the reference field, the second element being a device interface element of the wafer-based device;

generating an optical reference beam that intersects a predetermined position in the reference field, including:
generating a laser processing beam and propagating the laser beam along an optical path that intersects the reference field; and
attenuating the laser processing beam;
detecting a relative position of a first element in the reference field, the first element being a probe element; and
aligning the first element to the second element, including aligning the device interface element within the reference field to the probe element based on the detected position of the probe element in the reference field and the determined position of the device interface element, and
processing material of the wafer-based device with the laser processing beam;
wherein determining the relative position of the device interface element to the reference field includes:
i) utilizing a laser beam positioner system to position a field of view of a first camera to at least one location in the reference field; and
ii) utilizing the first camera to detect the position of the reference features carried with the device interface element in the reference field.

7. A method as in claim 6, wherein detecting the position of the probe element in the reference field with respect to the position of the optical reference beam includes:
i) utilizing the laser beam positioner system to position the optical reference beam to intersect a predetermined location in the reference field;
ii) positioning a field of view of a second camera in the reference field and forming an image of the optical reference beam with the second camera while the optical reference beam is intersecting the predetermined location in the reference field;
iii) determining the position of the image of the optical reference beam in the second camera field of view;
iv) positioning the field of view of the second camera in the reference field and forming an image of one or more probe pin tips associated with a probe card with the second camera, the probe element being one of the one or more probe pins; and
v) determining the position of at least one probe pin tip in the second camera field of view.

8. A method as in claim 7, wherein forming an image of one or more probe pin tips associated with a probe card with the second camera further comprises:
illuminating the probe pin tip and forming the image with a telecentric objective having a numerical aperture of about 0.18 or more.

9. A method as in claim 7, wherein forming an image of one or more probe pin tips associated with a probe card with the second camera further comprises:
illuminating the probe pin tip from the field of view of the first camera with an illuminator coaxial with the field of view of the first camera thereby backlighting the probe pin.

10. A method as in claim 7, wherein forming an image of one or more probe pin tips associated with a probe card with the second camera further comprises:
illuminating the probe pin tip with a ring light and forming the image with a 1× objective.

11. A method as in claim 7, wherein positioning a field of view of a second camera in the reference field and forming an image of the optical reference beam while the optical reference beam is at the predetermined location in the reference field includes:

initiating movement of the second camera to view the probe element in the reference field;
based at least in part on at least one of: i) an amount of movement of the second camera to view the probe element, and ii) a position of the probe element in the reference field, determining a difference between the relative position of the probe element and an expected position of the probe element; and
aligning the device interface element with the probe element based on the difference between the relative position of the probe element and an expected position of the probe element.

12. A method as in claim 11, wherein aligning the device interface element to the probe element includes adjusting a position of at least one of the probe element and the device interface element by an amount specified by the difference in order for the probe element to contact the device interface element.

13. A method as in claim 7, wherein aligning the device interface element within the reference field to the probe element includes automatically moving at least one of the probe card and the device interface element to precisely contact the one or more probe pins of the probe card to one or more device interface elements, the device interface element being a contact pad of a device.

14. A method as in claim 7, wherein forming an image of the optical reference beam with the second camera is forming and image of a focused or a defocused laser beam, wherein the laser beam wavelength is infrared, visible, or ultraviolet and wherein the camera is sensitive to the laser wavelength.

15. A method, comprising:
positioning a wafer-based device in a reference field;
determining a relative position of a second element in the reference field, the second element being a device interface element of the wafer-based device;
generating an optical reference beam that intersects a predetermined position in the reference field, including:
generating a laser processing beam and propagating the laser beam along an optical path that intersects the reference field; and
attenuating the laser processing beam;
detecting a relative position of a first element in the reference field, the first element being a probe element; and
aligning the first element to the second element, including aligning the device interface element within the reference field to the probe element based on the detected position of the probe element in the reference field and the determined position of the device interface element, and
processing material of the wafer-based device with the laser processing beam;
wherein:
the first element is a first contact element, and the second element is a second contact element;
determining a relative position of the second element in a reference field is based on use of a first imaging system;
generating an optical reference beam that intersects a predetermined position in the reference field is to align a second imaging system;
detecting a relative position of the first element in the reference field is based on use of the second imaging system; and
aligning the first element to the second element is based on the relative position of the first element and the relative position of the second element in the reference field.

16. A method as in claim 15, wherein aligning the first contact element to the second contact element further comprises initiating movement of at least one of the first contact element and the second contact element to touch the first contact element to the second contact element and form an electrical connection between test equipment and a circuit under test, including:
  initiating movement of at least one of: i) a probe card to which the first contact element is attached, the first contact element being a pin on the probe card, and ii) a circuit substrate to which the second contact element is attached, the second contact element being a test pad associated with a circuit under test on the circuit substrate;
  utilizing a source that generates the optical reference beam to generate a laser beam that is applied to the circuit under test; and
  trimming a component of the circuit under test with the applied laser beam.

17. A method as in claim 15, wherein determining the relative position of the second contact element in the reference field includes:
  utilizing the first imaging system to identify a pattern of multiple pads on a circuit substrate, the second contact element being one of multiple contact pads on a circuit substrate;
  and wherein detecting the relative position of the first contact element includes:
  i) utilizing the laser beam positioner system to position the optical reference beam to a specific location in the reference field to align a camera associated with the second imaging system;
  ii) initiating movement of the camera for viewing the optical reference beam while the optical reference beam is in the specific location in the reference field; and
  iii) utilizing the camera to identify a pattern of multiple probe pins associated with a probe card, the first contact element being one of the multiple probe pins on the probe card.

18. A method as in claim 15, wherein:
  determining the relative position of the second contact element in the reference field includes viewing the second contact element from a first side of the reference field; and
  detecting the relative position of the first contact element in the reference field includes moving a camera associated with the second imaging system, the camera being rigidly mounted to a movable assembly that retains a circuit substrate upon which the second contact element resides and viewing the first contact element in the reference field from a second side of the reference field utilizing the camera, the second side of the reference field being opposite the first side of the reference field.

19. A method as in claim 15, wherein detecting the relative position of the first contact element in the reference field includes utilizing the second imaging system, which is rigidly mounted to a movable assembly, to identify the relative position of the first contact element in the reference field, the movable assembly retaining a circuit substrate upon which the second contact element resides, and wherein the method further comprises:
  initiating movement of the movable assembly to view the first contact element with a low magnification camera of the second imaging system; and
  initiating movement of the movable assembly to view the first contact element with a high magnification camera of the second imaging system, the high magnification camera being rigidly mounted adjacent to the low magnification camera on the movable assembly.

20. A method, comprising:
  positioning a wafer-based device in a reference field;
  determining, based on use of a first imaging system, a relative position of a second contact element in the reference field, the second contact element being a test pad associated with a circuit under test on the wafer-based device;
  generating an optical reference beam that intersects a predetermined position in the reference field, to align a second imaging system;
  detecting a relative position of a first contact element in the reference field, based on use of the second imaging system, the first contact element being a pin on a probe card;
  aligning the first contact element to the second contact element based on the relative position of the first contact element and the relative position of the second contact element in the reference field, the aligning including initiating movement of at least one of the first contact element and the second contact element to touch the first contact element to the second contact element and form an electrical connection between test equipment and the circuit under test, including:
    (a) initiating movement of at least one of: i) the probe card, and ii) the wafer-based device; and
    (b) utilizing a source that generates the optical reference beam to generate a laser beam that is applied to the circuit under test; and
  trimming a component of the circuit under test with the applied laser beam.

21. A method as in claim 20, wherein determining the relative position of the second contact element in the reference field includes:
  utilizing the first imaging system to identify a pattern of multiple pads on the circuit substrate, the second contact element being one of multiple contact pads on a circuit substrate;
  and wherein detecting the relative position of the first contact element includes:
  i) utilizing the laser beam positioner system to position the optical reference beam to a specific location in the reference field to align a camera associated with the second imaging system;
  ii) initiating movement of the camera for viewing the optical reference beam while the optical reference beam is in the specific location in the reference field; and
  iii) utilizing the camera to identify a pattern of multiple probe pins associated with a probe card, the first contact element being one of the multiple probe pins on the probe card.

22. A method as in claim 20, wherein:
  determining the relative position of the second contact element in the reference field includes viewing the second contact element from a first side of the reference field; and
  detecting the relative position of the first contact element in the reference field includes moving a camera associated with the second imaging system, the camera being rigidly mounted to a movable assembly that retains a circuit substrate upon which the second contact element resides and viewing the first contact element in the reference field from a second side of the reference field utilizing the camera, the second side of the reference field being opposite the first side of the reference field.

23. A method as in claim 20, wherein detecting the relative position of the first contact element in the reference field includes utilizing the second imaging system, which is rigidly mounted to a movable assembly, to identify the relative position of the first contact element in the reference field, the movable assembly retaining a circuit substrate upon which the second contact element resides, and wherein the method further comprises:

initiating movement of the movable assembly to view the first contact element with a low magnification camera of the second imaging system; and initiating movement of the movable assembly to view the first contact element with a high magnification camera of the second imaging system, the high magnification camera being rigidly mounted adjacent to the low magnification camera on the movable assembly.

* * * * *